(12) United States Patent
Hamatani et al.

(10) Patent No.: US 8,240,030 B2
(45) Date of Patent: Aug. 14, 2012

(54) METHOD FOR MANUFACTURING ELECTRONIC DEVICE

(75) Inventors: Toshiji Hamatani, Tochigi (JP); Takahiro Fukutome, Tochigi (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/851,247

(22) Filed: Aug. 5, 2010

(65) Prior Publication Data

US 2011/0030212 A1 Feb. 10, 2011

(30) Foreign Application Priority Data

Aug. 7, 2009 (JP) ................................. 2009-185126

(51) Int. Cl.
*H05K 3/36* (2006.01)

(52) U.S. Cl. ............... 29/830; 29/825; 29/832; 29/846; 29/852

(58) Field of Classification Search ................... 29/825, 29/830, 832, 846, 852
See application file for complete search history.

(56) References Cited

U.S. PATENT DOCUMENTS

| | | | |
|---|---|---|---|
| 5,597,631 A | 1/1997 | Furumoto et al. | |
| 5,770,313 A | 6/1998 | Furumoto et al. | |
| 5,879,502 A | 3/1999 | Gustafson | |
| 5,888,609 A | 3/1999 | Karttunen et al. | |
| 6,476,330 B2 | 11/2002 | Otsuka et al. | |
| 6,482,495 B1 | 11/2002 | Kohama et al. | |
| 6,926,794 B2 | 8/2005 | Kohama et al. | |
| 7,067,392 B2 | 6/2006 | Yamazaki et al. | |
| 7,193,308 B2 * | 3/2007 | Matsui | 257/686 |
| 7,465,674 B2 | 12/2008 | Tamura et al. | |
| 7,504,317 B2 | 3/2009 | Aoki et al. | |
| 7,510,950 B2 | 3/2009 | Tsurume et al. | |
| 7,564,121 B2 * | 7/2009 | Sugimoto | 257/659 |
| 7,667,310 B2 | 2/2010 | Dozen et al. | |
| 7,786,576 B2 * | 8/2010 | Kodaira | 257/730 |
| 7,880,091 B2 * | 2/2011 | Miyamoto et al. | 174/255 |
| 2007/0004125 A1 | 1/2007 | Watanabe et al. | |
| 2007/0069375 A1 * | 3/2007 | Sugimoto | 257/723 |
| 2007/0181875 A1 | 8/2007 | Yamazaki et al. | |
| 2008/0044940 A1 | 2/2008 | Watanabe et al. | |
| 2008/0224940 A1 | 9/2008 | Sugiyama et al. | |
| 2008/0224941 A1 | 9/2008 | Sugiyama et al. | |
| 2008/0242005 A1 | 10/2008 | Dozen et al. | |
| 2008/0303140 A1 | 12/2008 | Ohtani et al. | |
| 2009/0057875 A1 | 3/2009 | Aoki et al. | |
| 2009/0085182 A1 | 4/2009 | Yamazaki et al. | |
| 2009/0289341 A1 | 11/2009 | Yamazaki et al. | |
| 2009/0302455 A1 | 12/2009 | Chida et al. | |
| 2009/0302457 A1 | 12/2009 | Chida et al. | |
| 2009/0314527 A1 | 12/2009 | Hatano et al. | |
| 2011/0032679 A1 * | 2/2011 | Baek et al. | 361/715 |

FOREIGN PATENT DOCUMENTS

JP 05-286065 11/1993
(Continued)

*Primary Examiner* — Carl Arbes
(74) *Attorney, Agent, or Firm* — Nixon Peabody, LLP; Jeffrey L. Costellia

(57) ABSTRACT

To provide a method for forming an opening with high accuracy in an insulating film obtained by curing a prepreg including a reinforcing material in a step of exposing a terminal portion sealed with the insulating film, with the use of a means other than laser beam irradiation. A protrusion is formed using a conductor. An uncured prepreg including a reinforcing material is closely attached to the protrusion and the prepreg is cured, so that an insulating film including the reinforcing material is formed. A portion of a top surface of the insulating film protrudes due to the protrusion. The protruding portion is preferentially removed together with the reinforcing material to form an opening in the insulating film by grinding treatment or the like, so that an opening which exposes the protrusion is formed in the insulating film.

37 Claims, 16 Drawing Sheets

FOREIGN PATENT DOCUMENTS

| | | |
|---|---|---|
| JP | 2001-331120 | 11/2001 |
| JP | 2002-290006 | 10/2002 |
| JP | 2003-049388 | 2/2003 |
| JP | 2003-228695 | 8/2003 |
| JP | 2007-091822 | 4/2007 |
| JP | 2008-257710 | 10/2008 |
| JP | 2008-262547 | 10/2008 |
| WO | WO 96/09158 | 3/1996 |

* cited by examiner

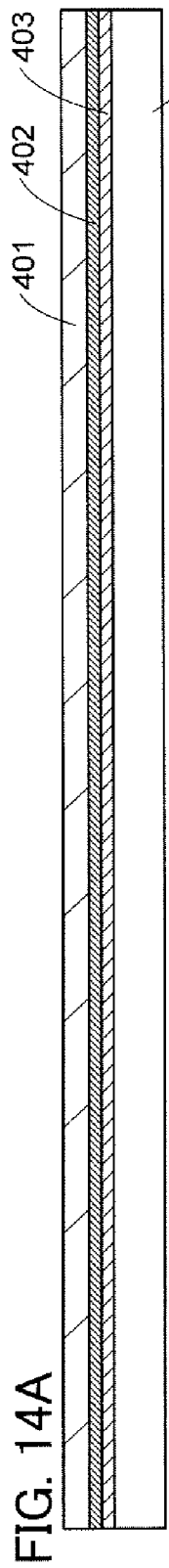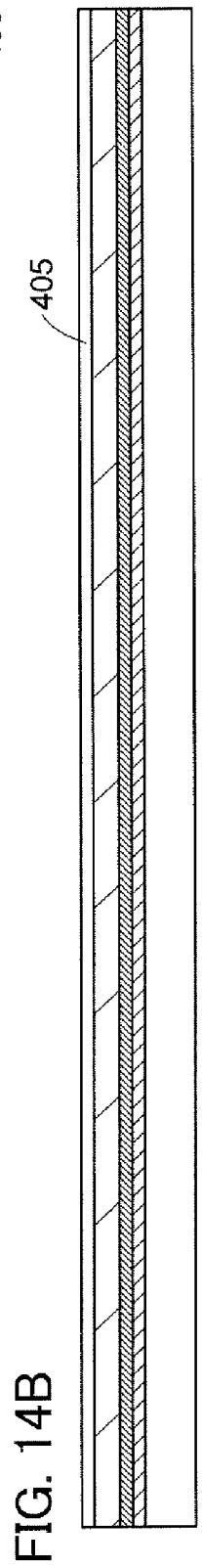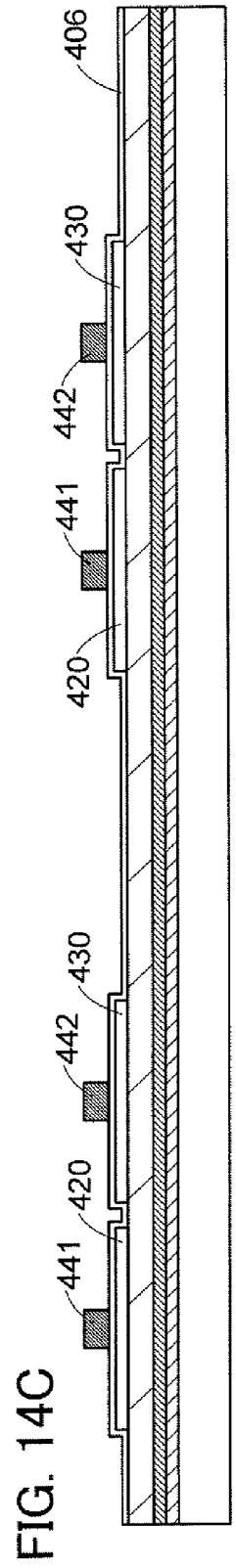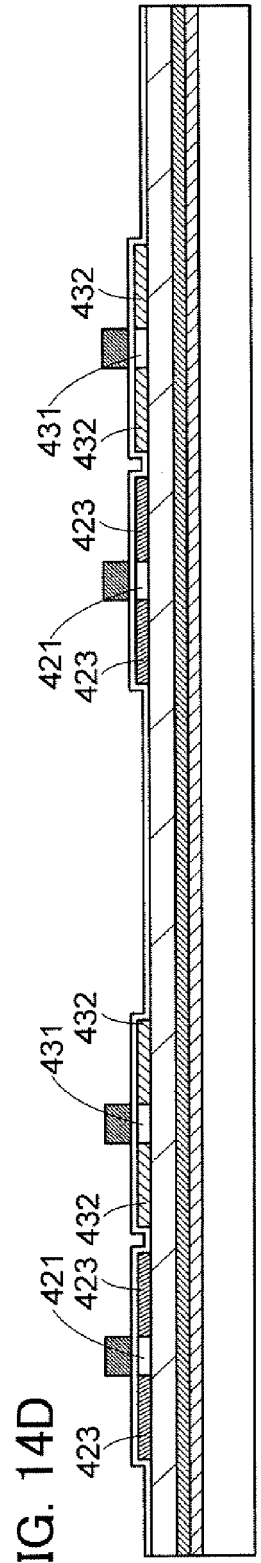

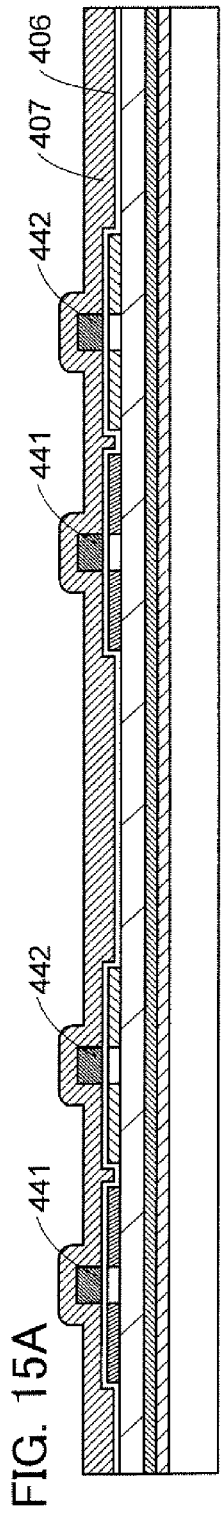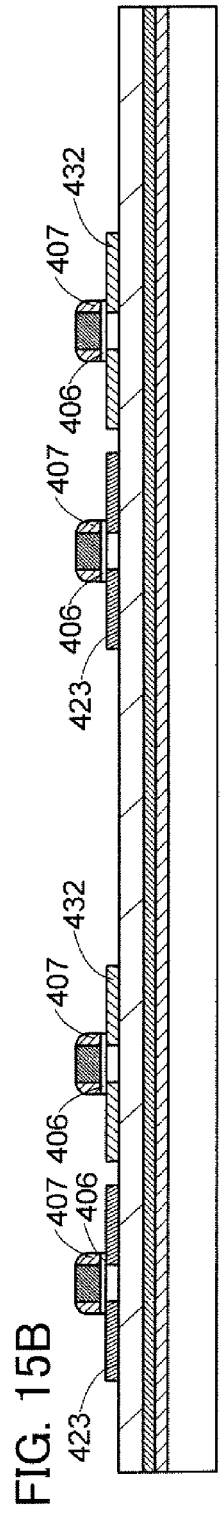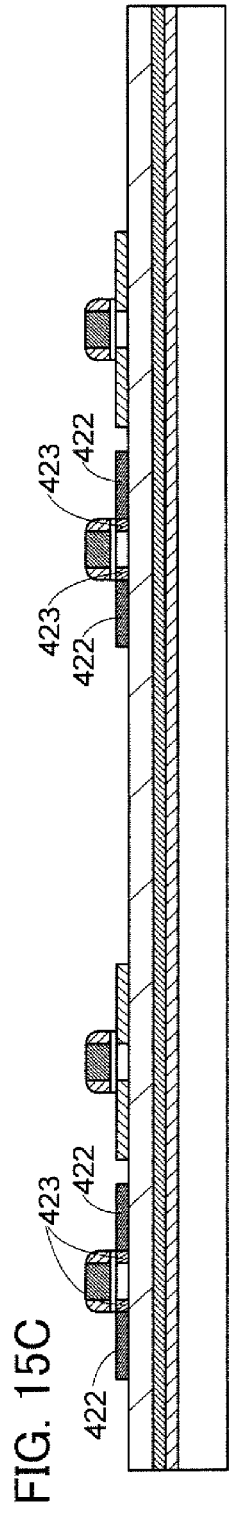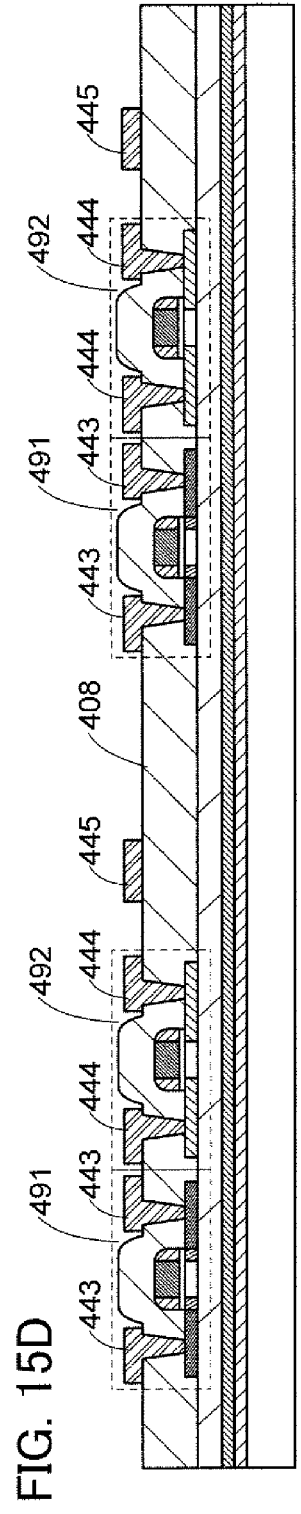

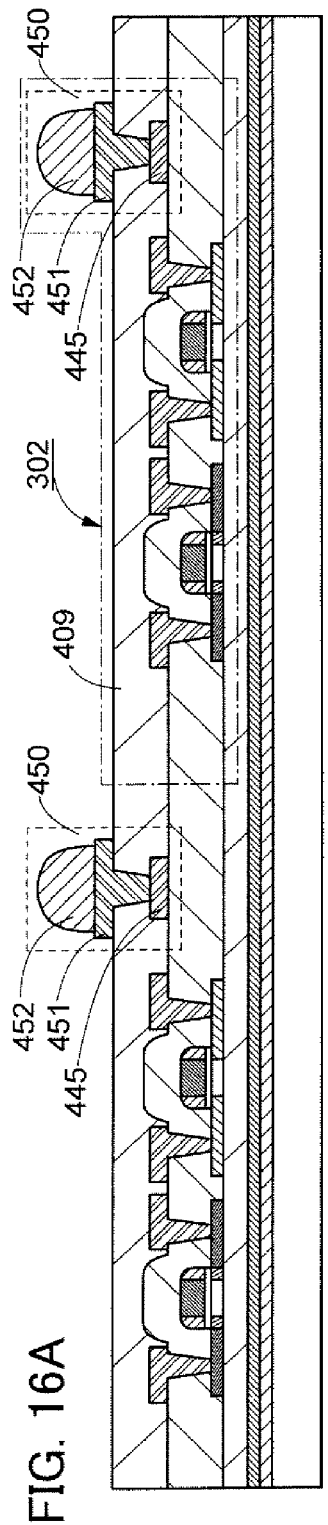
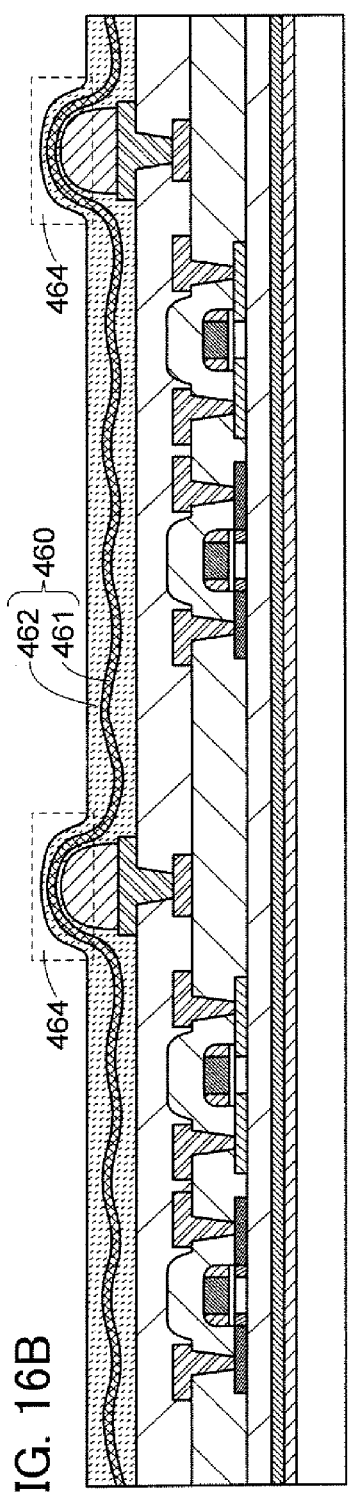
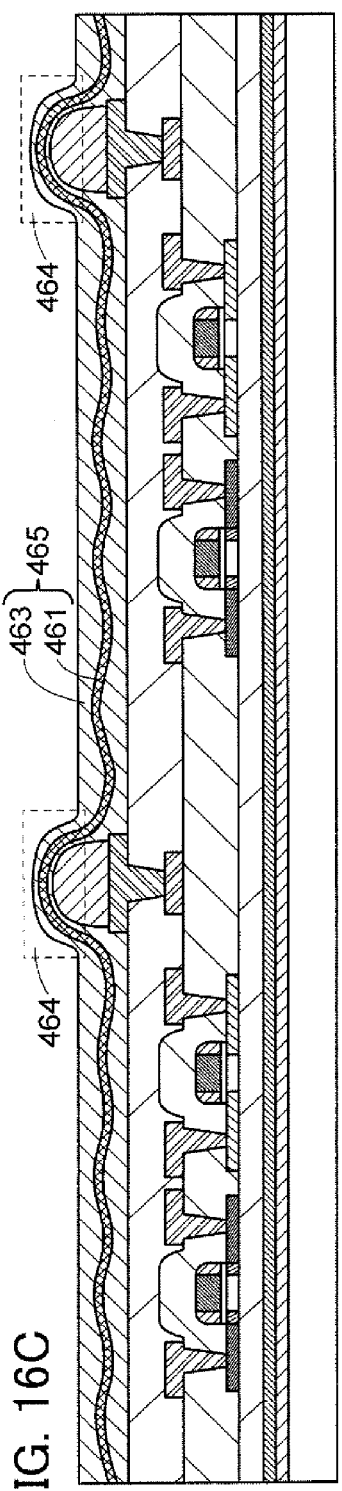

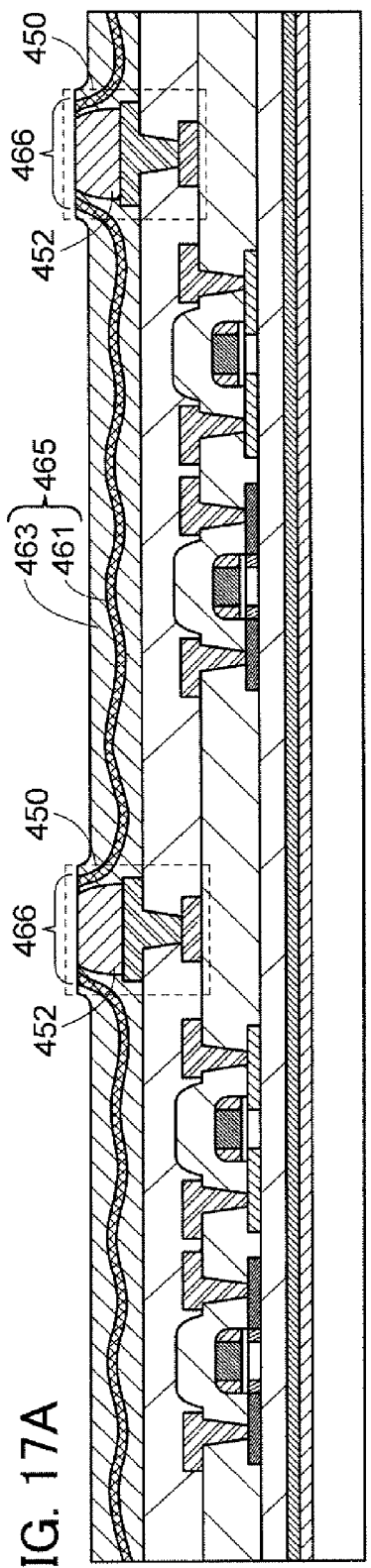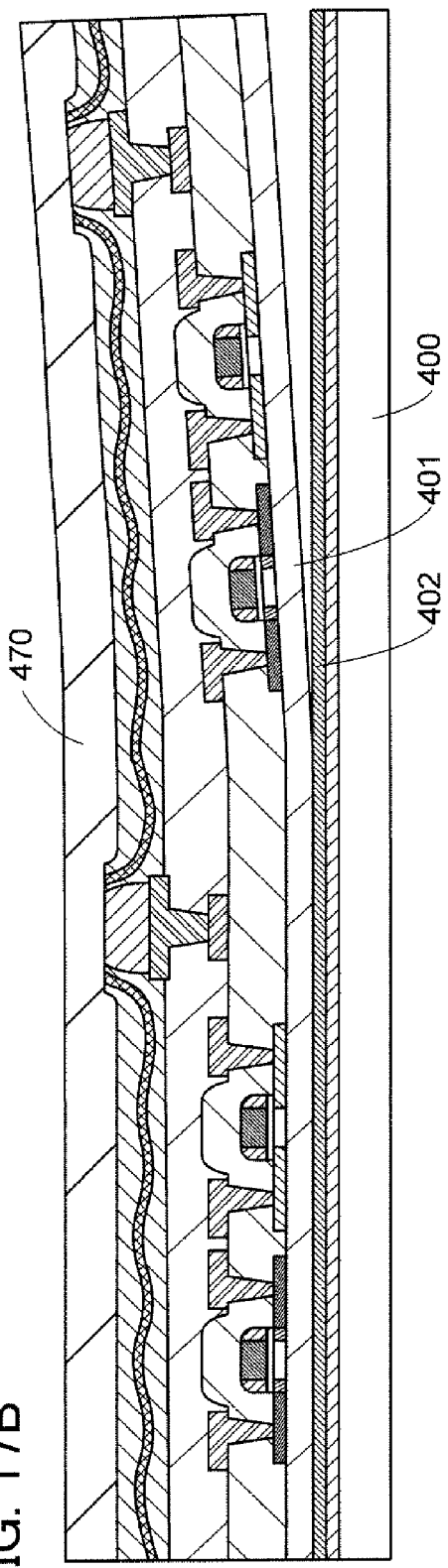
FIG. 17A
FIG. 17B

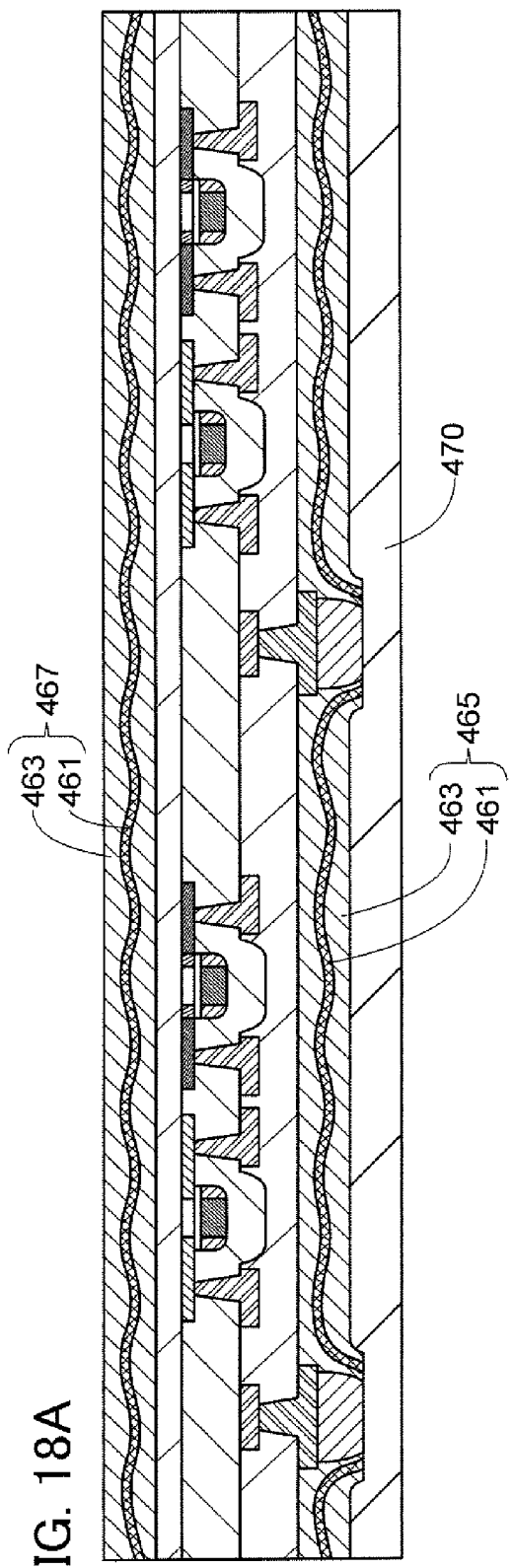
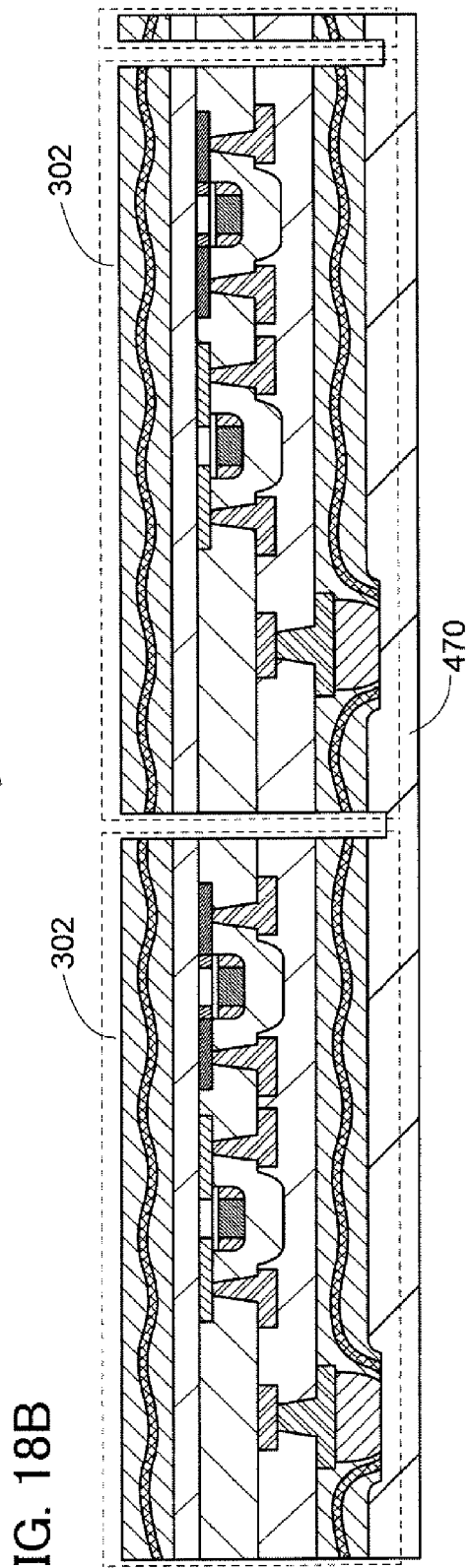
FIG. 18A
FIG. 18B

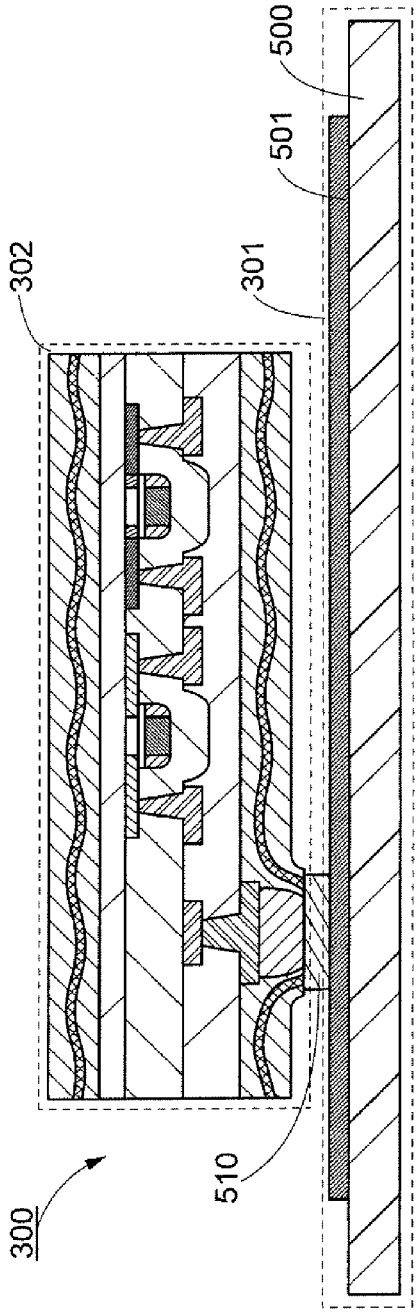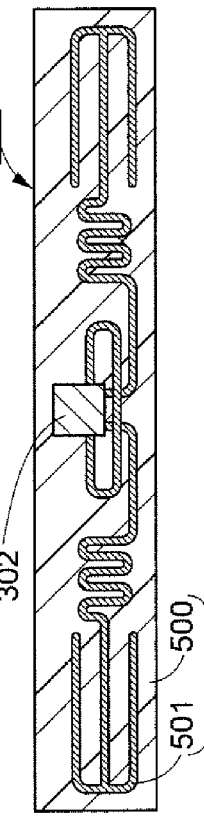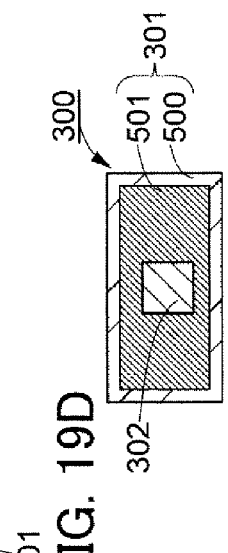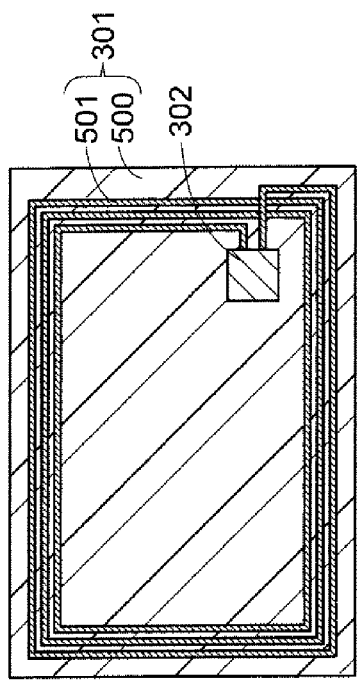

METHOD FOR MANUFACTURING ELECTRONIC DEVICE

BACKGROUND OF THE INVENTION

1. Field of the Invention

In this specification, a terminal structure including a conductor covered with an insulating film will be described. Further, an electronic device provided with a terminal having such a structure will also be described.

2. Description of the Related Art

A resin layer formed by curing a prepreg including a reinforcing material such as a glass fiber or a glass filler is applied to a support, an insulating film, a protective material, or the like of a printed wiring board, an electronic device, or the like (for example, see Patent Documents 1 to 4). Since a multilayer wiring is formed, an opening penetrating a resin layer formed using a prepreg is formed in this layer in order to form an electrical connection portion with the external.

For example, Patent Document 1 discloses that an insulating layer of a printed wiring board is formed using a prepreg and an opening is formed in the insulating layer with laser treatment, drilling, or punching-out.

Patent Documents 2 and 3 disclose that an opening is formed in a cured prepreg by performing a step of laser beam irradiation or a photolithography step in order to form a connection terminal for an electronic device sealed with the cured prepreg.

Patent Document 4 discloses that a support of an electronic component is formed using a prepreg and that a resin layer in which an electronic component and a conductor electrically connected to the electronic component are embedded is formed and a surface of the resin layer is grinded in order to expose the conductor.

REFERENCE

[Patent Document 1] Japanese Published Patent Application No. 2007-091822
[Patent Document 2] Japanese Published Patent Application No. 2008-257710
[Patent Document 3] Japanese Published Patent Application No. 2008-262547
[Patent Document 4] Japanese Published Patent Application No. 2002-290006

SUMMARY OF THE INVENTION

By using a prepreg including a reinforcing material as a sealing film, an electronic element can be sealed with a resin film including the reinforcing material; therefore, the strength of the electronic element can be increased. Meanwhile, in the case where an opening is formed in the sealing film in order to expose an extraction terminal of an electronic element, the reinforcing material is also needed to be removed with the resin film. The reinforcing material is troublesome when the opening is formed in the resin film.

As disclosed in Patent Document 1, an opening is formed in a resin film formed using a prepreg with drilling, punching, and treatment with a laser beam. For formation of an opening in a resin layer with which an electronic element is sealed, drill treatment and punching treatment are not suitable. Treatment with a laser beam is employed in order not to damage the electronic element.

However, the step of forming an opening with the use of a laser beam takes much time and needs a skill because it is difficult to determine whether both the resin film and the reinforcing material are removed. Thus, depending on the skill of an operator, the resin film and/or the reinforcing material might be insufficiently removed and thus the areas of regions exposed in openings might vary. Accordingly, the values of connection resistance of two conductors electrically connected through an opening vary, which makes it difficult to manufacture an electric element having electric characteristics with a designed value.

In addition, in the case of employing the step of forming an opening with the use of a laser beam, a mechanical impact on an electronic element is small as compared to drilling or a punching; however, the possibility that performance of the electronic element is degraded by energy of a laser beam cannot be completely eliminated. In the study by inventors of the present invention, it is found that characteristics of an electronic element with a small size and a high-performance electronic element driven with low voltage are degraded due to laser beam irradiation in a step of forming an opening in a sealing layer in some cases.

A technical object in this specification is to provide a method for forming an opening with high accuracy in an insulating film formed by curing a prepreg including a reinforcing material, with the use of a means other than laser beam irradiation.

A method for manufacturing a terminal structure, according to an embodiment of the present invention, includes forming a protrusion formed using a conductor over an insulating surface, closely attaching a prepreg including a reinforcing material to the insulating surface and a surface of the protrusion to form a portion of a top surface of the prepreg, which protrudes due to the protrusion, curing the prepreg closely attached to the insulating surface and the surface of the protrusion to form an insulating film including the reinforcing material, and removing a protruding portion of a top surface of the insulating film together with the reinforcing material to form an opening in the insulating film. Note that part of the protrusion may be removed in the step of forming the opening.

According to this embodiment, an opening can be easily formed with high accuracy in an insulating film formed by curing a prepreg including a reinforcing material, with the use of a means other than laser beam irradiation. This is because according to this embodiment, the position where an opening is formed can be determined in a self-aligned manner depending on the position where a protrusion is formed, and the accuracy of the position where an opening is formed can be ensured by the accuracy of the position where the protrusion is formed and the shape and size of the opening can be controlled by changing the height and shape of the protrusion. Therefore, in the step of forming the opening, highly accurate alignment like determination of a position where laser beam irradiation is performed is not necessary.

By grinding an insulating film including a reinforcing material, an opening can be formed in the insulating film. As described above, the opening can be formed in the insulating film in a self-aligned manner. Therefore, by simply grinding the insulating film in a direction parallel to a horizontal surface, the opening can be formed in a self-aligned manner in the insulating film.

In the manufacturing method according to the above embodiment, an insulating film may be formed by curing an uncured resin film which does not include a reinforcing material instead of a prepreg including a reinforcing material. In that case, the above advantageous effect can also be obtained. As a reinforcing material, a sheet fiber can be used. After formation of an opening, a conductor closely attached to a protrusion may be formed.

A method for manufacturing an electronic device, according to an embodiment of the present invention, includes forming a conductive protrusion electrically connected to at least one of electronic elements, over a first insulating film, closely attaching a prepreg including a reinforcing material to a top surface of the first insulating film and a surface of the protrusion to form a portion of a top surface of the prepreg, which protrudes due to the protrusion, curing the prepreg closely attached to the top surface of the first insulating film and the surface of the protrusion to form a second insulating film including the reinforcing material, and removing a protruding portion of a top surface of the second insulating film together with the reinforcing material to form an opening in the second insulating film. Note that a part of the protrusion may be removed in the step of forming the opening.

Thus, in the method for manufacturing an electronic device, according to the above embodiment, as described above, an opening can be easily formed with high accuracy in an insulating film formed by curing a prepreg including a reinforcing material, with the use of a means other than laser beam irradiation.

In the method for manufacturing an electronic device, according to the above embodiment, a sheet fiber can be used as the reinforcing material. After formation of the opening, a conductor closely attached to the protrusion may be formed. The second insulating film may be formed by curing an uncured resin film which does not include a reinforcing material.

In the method for manufacturing an electronic device, according to the above embodiment, in the case where an electronic element is provided over a substrate used when the electronic element is formed, a step of separating the substrate from the electronic element may be performed. For example, this step is preferably performed with the electronic element sealed with the second insulating film after the second insulating film is formed. In that case, the substrate may be separated either before or after the opening is formed in the second insulating film.

In a method for manufacturing an electronic device, according to an embodiment of the present invention, the accuracy of the position where the opening is formed in an insulating film (cured prepreg) including a reinforcing material is ensured in a self-aligned manner by the accuracy of the position where a protrusion is formed and the shape and size of the opening can be controlled by changing the height and shape of the protrusion. Therefore, by applying this embodiment, an opening can be easily formed in an insulating film including a reinforcing material with high accuracy, with the use of a means other than laser beam irradiation.

BRIEF DESCRIPTION OF THE DRAWINGS

FIGS. 14A to 14D are cross-sectional views illustrating an example of a method for manufacturing an electronic device according to one embodiment of the present invention.

FIGS. 15A to 15D are cross-sectional views illustrating an example of steps following the step in FIG. 14D.

FIGS. 16A to 16C are cross-sectional views illustrating an example of steps following the step in FIG. 15D.

FIGS. 17A and 17B are cross-sectional views illustrating an example of steps following the step in FIG. 16C.

FIGS. 18A and 18B are cross-sectional views illustrating an example of steps following the step in FIG. 17B.

FIG. 19A is a cross-sectional view illustrating an example of a step following the step in FIG. 18B and a structure example of an electronic device, and FIGS. 19B to 19D are plan views each illustrating a structure example of the electronic device in FIG. 19A.

DETAILED DESCRIPTION OF THE INVENTION

Figure 1A:
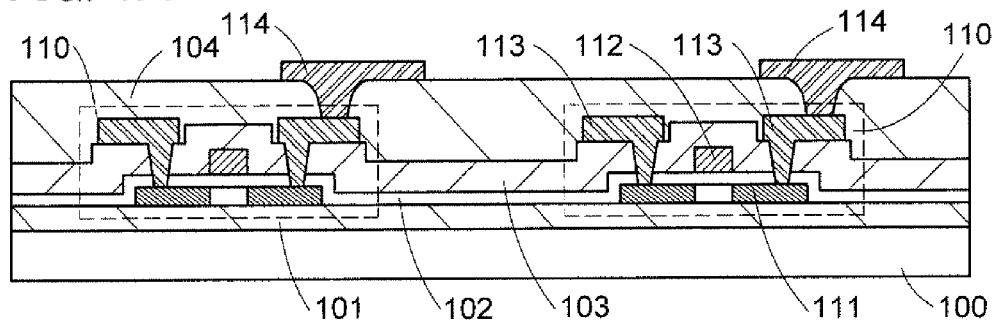
FIGS. 1A to 1D are cross-sectional views illustrating an example of a method for manufacturing an electronic device according to one embodiment of the present invention.

Embodiments of the invention disclosed in this specification will be described with reference to the accompanying drawings. Note that in the drawings referred to in this specification, components denoted by the same reference numerals in different drawings represent the same components. Therefore, the description regarding such components, which is repetitive, will be omitted in some cases.

In addition, it is easily understood by those skilled in the art that modes of the invention disclosed in this specification are not limited to the description in the embodiments and can be modified in various ways. That is, the invention disclosed in this specification should not be interpreted as being limited to the description of the embodiments.

Embodiment 1

In this embodiment, a terminal structure covered with n insulating film formed from a cured prepreg which includes a reinforcing material or cured resin film and a method for manufacturing the terminal structure will be described. Further, in this embodiment, an electronic device provided with a terminal having such a structure and a method for manufacturing the electronic device will also be described.

Terminal Structure

The terminal structure of this embodiment includes a conductor, a resin film including a reinforcing material and covering the conductor, and an opening formed in a region of the resin film, which overlaps with the conductor. In this opening, the conductor is exposed at a surface of the resin film and thus, the conductor can be electrically connected to another conductor.

Description of Insulating Surface

In the terminal structure, a first conductor is formed over an insulating surface, for example. As the insulating surface, for example, a surface of an insulator such as an insulating film formed with a deposition method, e.g., a CVD method or a PVD method, oxidation treatment, or the like; a resin substrate; a resin film; a glass substrate; or a quartz substrate.

Description of Electronic Device

The electronic device of this embodiment includes one or more electronic elements, a conductor having a projecting portion or a recessed portion, which is electrically connected to at least one of the electronic elements, and a resin film including a reinforcing material and covering the electronic element and the conductor, and an opening formed in a region of the resin film, which overlaps with the conductor. In this opening, the conductor is exposed at a surface of the resin film and thus, the conductor can be electrically connected to another conductor.

A method for manufacturing the terminal structure of this embodiment and a method for manufacturing the electronic device of this embodiment and the structures of the terminal structure and the electronic device will be described with reference to FIGS. 1A to 1D, FIGS. 2A to 2D, FIG. 3, FIGS. 4A and 4B, and FIGS. 5A to 5C.

As illustrated in FIG. 1A, a substrate 100 over which one or more electronic elements 110 is formed with an insulating film 101 therebetween is prepared. There is no particular limitation on the electronic element 110 and a practitioner can determine the kind, the structure, the number, and the manufacturing method. As specific examples of the electronic element 110, a transistor, a resistor, a rectifier, a capacitor, a memory element, a photoelectric conversion element, a light-emitting element, a sensor element, and a wiring board are given.

Description of Electronic Element 110 (Transistor)

In FIG. 1A, a transistor having an SOI structure is illustrated as an example of the electronic element 110 and the number of the transistor is one for simplification. As illustrated in FIG. 1A, a semiconductor layer 111, a conductive film 112 serving as a gate electrode, and a conductive film 113 serving as a source electrode and/or a drain electrode, which are in the transistor, are formed over the insulating film 101. Here, the insulating film 101 serves as a base insulating film of the transistor. The semiconductor layer 111 includes at least a channel formation region, a source region, and a drain region. The semiconductor layer 111 of the transistor is covered with the insulating film 102 and the conductive film 112 is formed over the insulating film 102. Here, the insulating film 102 serves as a gate insulating film of the transistor. The conductive film 112 is covered with an insulating film 103 and the conductive film 113 is formed over the insulating film 103.

As the substrate 100, a substrate such as a semiconductor substrate, a glass substrate, a quartz substrate, a sapphire substrate, a ceramic substrate, a stainless steel substrate, or a metal substrate can be used. As a semiconductor substrate, a silicon wafer obtained by slicing an ingot, an SOI substrate in which a single crystal semiconductor layer is formed over a substrate with an insulating film therebetween, or the like can be used. Further, in the case where a semiconductor substrate such as a silicon wafer obtained by slicing an ingot is used as the substrate 100, the electronic element 110 including a semiconductor region is formed over the silicon wafer (the substrate 100).

Each of the insulating films 101 to 103 has either a single-layer structure or a layered structure. Insulating films used as the insulating films 101 to 103 are selected in consideration of the condition of a manufacturing process of the electronic element 110 and the functions of these films. For example, an insulating film containing silicon and/or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, the following may be used: an insulating film formed from oxide of metal, such as aluminum oxide, tantalum oxide, or hafnium oxide; an insulating film formed from nitride of metal, such as aluminum nitride; an insulating film formed from oxynitride of metal, such as aluminum oxynitride; or an insulating film formed from nitride oxide of metal, such as aluminum nitride oxide. Furthermore, a resin film formed from a resin material such as acrylic, polyimide, polyamide, polyimideamide, or benzocyclobutene may be used. Note that in this specification, oxynitride is a substance in which the content of oxygen is larger than that of nitrogen and nitride oxide is a substance in which the content of nitrogen is larger than that of oxygen.

There are the following typical examples of the method for forming these insulating films: a CVD method (chemical vapor deposition method) such as a PECVD (plasma-excited CVD) method or a thermal CVD method; a PVD method (physical vapor deposition method) such as a sputtering method or a vapor deposition method; an ALD method (atomic layer deposition method); a method for forming a film with a liquid or paste material, such as a spin-coating method, a droplet discharging method, or a dip-coating method; solid-phase oxidation treatment or solid-phase nitridation treatment with plasma or heat; and the like.

Further, each of the conductive films 112 and 113 has either a single-layer structure or a layered structure. Each of the conductive films 112 and 113 can be formed using a metal film containing single metal such as tantalum, tungsten, titanium, molybdenum, aluminum, chromium, niobium, gold, silver, copper, or platinum, as its main component, an alloy film, a metal compound film, or the like. For example, as the metal film, a copper film, a pure aluminum film, and an aluminum film to which Si, Nb, or the like is added are given. As the alloy film, an aluminum-copper alloy film and an aluminum-neodymium alloy film are given. As the metal compound film, a metal nitride film such as a titanium nitride film or a tungsten nitride film, and a silicide film such as a nickel silicide film or a cobalt silicide film are given. These conductive films can be formed with a PVD method such as a sputtering method or a vapor deposition method; a method for forming a film with a liquid or paste material, such as a printing method, a droplet discharging method, or a dip-coating method; a soldering method; a plating method; or the like.

Next, as illustrated in FIG. 1A, the insulating film 104 is formed to cover the electronic element 110, and a conductive film 114 electrically connected to the conductive film 113 of the electronic element 110 is formed over the insulating film 104. The conductive film 114 is formed to electrically connect a conductive protrusion formed over the insulating film 104 to the electronic element 110 and constitutes a connection portion of the electronic element 110 included in an electronic device. Thus, the conductive film 114 is electrically connected to at least one of the electronic elements 110.

The insulating film 104 can be formed in a manner similar to those of the insulating films 101 to 103. For example, in the case where the insulating film 104 has a two-layer structure of a silicon nitride oxide film and a resin film, the insulating film 104 having openings can be formed as follows. First, a silicon nitride oxide film with a thickness of approximately 50 nm to 300 nm is formed over the insulating film 103 in a PECVD apparatus using $SiH_4$, $N_2O$, $NH_3$, and $H_2$ for a source gas. Then, a film formed from an uncured photosensitive epoxy-phenol resin material is formed over the silicon nitride oxide film with a printing method. Next, the uncured resin film is irradiated with light having an appropriate wavelength to be cured, so that the resin film with a thickness of approximately 1 μm to 30 μm is formed. At that time, a portion of the resin film, which is to be a conduction region between the conductive film 113 and the conductive film 114, is not cured. After that, a portion of the silicon nitride oxide film in a first layer, which is to be a conduction region, is etched, and thus, the insulating film 104 including the openings is completed.

Then, the conductive film 114 is formed over the insulating film 104. The conductive film 114 can be formed in a manner similar to those of the conductive films 112 and 113. For example, a titanium film is formed with a sputtering method and the titanium film is etched to form the conductive film 114.

Figure 1B:
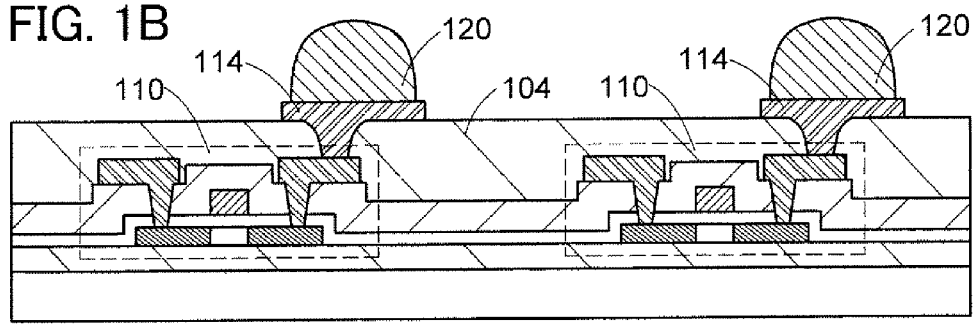

Next, conductive protrusions 120 are formed over the insulating film 104 (an insulating surface) as illustrated in FIG. 1B. The conductive protrusion 120 is also referred to as a bump and may function as a terminal portion of the electronic device. The conductive protrusion 120 (hereinafter referred to as the "protrusion 120") is electrically connected to at least one of the electronic elements 110 included in the electronic device. In this embodiment, the protrusion 120 is formed in close contact with the conductive film 114, whereby the protrusion 120 is electrically connected to the electronic element 110. Alternatively, the protrusion 120 may be formed in contact with the conductive film 113 without formation of the conductive film 114.

The protrusion 120 is preferably formed using a conductive material having fluidity, such as conductive paste containing conductive microparticles or conductive powder or conductive liquid containing conductive microparticles or conductive powder. This is because when such a conductive material is used, the protrusion 120 can be formed with a droplet discharging method (including an ink-jet method, a dispensing method, and the like), a printing method such as a screen printing method, or the like. These methods allow formation of a projecting conductor at a portion where the projecting conductor needed to be formed, without a deposition step using a complex deposition apparatus such as a CVD apparatus or a sputtering apparatus and an exposure step for forming a photomask.

Description of Conductive Paste

The conductive paste and the conductive liquid are materials in which conductive particles or conductive powder are/is dispersed or conductive materials in which conductive particles or conductive powder are/is dissolved. For example, as a material of conductive powder or a conductive particle contained in the conductive liquid, metal such as Ag, Au, Cu, Ni, Pt, Pd, or Nb; an alloy of any of these metal materials (e.g., Ag—Pd); a conductive oxide material such as indium oxide or zinc oxide; and the like are given. Further, as a medium (a solvent or a disperse medium) in which conductive powder or conductive particles is/are dissolved or dispersed, for example, precursor materials of a photocurable resin and a thermosetting resin are given. As a UV curable resin, an acrylic resin and an epoxy resin are given. As a thermosetting resin, a polyimide resin is given.

The protrusion 120 may be formed using solder paste.

Here, the protrusion 120 is formed using commercially available silver paste. The silver paste is formed in a projecting shape with a printing method in a region where the protrusion 120 is to be formed. Then, the silver paste is baked in oven, so that the protrusion 120 containing silver is formed. The protrusion 120 protrudes from a top surface of the insulating film 104 as compared to any portion of the electronic element 110.

Attachment of Prepreg

Next, an uncured (incompletely cured) prepreg 130 including a reinforcing material 131 is prepared, and the uncured prepreg 130 (hereinafter referred to as the "prepreg 130") is provided on the insulating film 104 side of the electronic device and is closely attached to surfaces of the insulating film 104 and the protrusions 120. The prepreg 130 is cured in such a state, and thus, the surfaces of the insulating film 104 and the protrusions 120 are covered with an insulating film 140 including the reinforcing material 131 (see FIGS. 1C and 1D and FIG. 2A). The insulating film 140 functions as a sealing film of the electronic elements 110 (electronic devices).

Figure 1C:
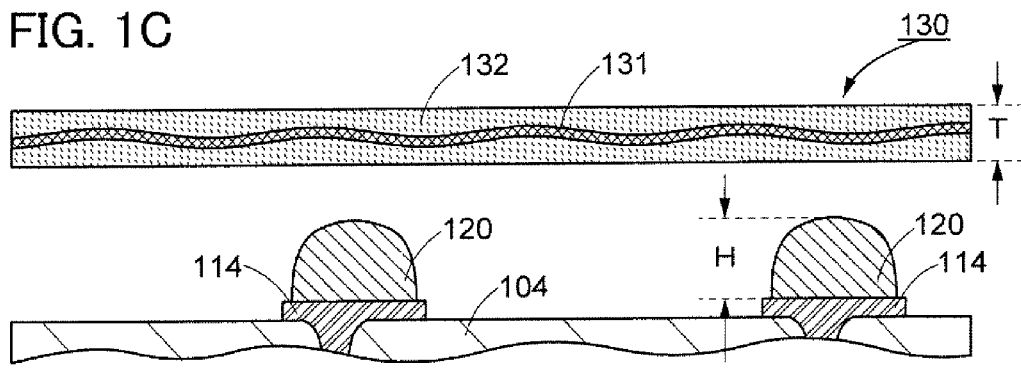

As illustrated in FIG. 1C, the uncured prepreg 130 is formed from the uncured resin 132 including the reinforcing material 131. Note that an uncured resin film which does not include the reinforcing material 131 may be used instead of the prepreg 130. The prepreg 130 including the reinforcing material 131 is preferably used because the terminal structure and the electronic device can be reinforced.

As a resin material of the uncured resin 132 (hereinafter referred to as the "resin 132"), a thermosetting resin such as an epoxy resin, an unsaturated polyester resin, a polyimide resin, a bismaleimide-triazine resin, or a cyanate resin can be used. Alternatively, a thermoplastic resin such as a polyphenylene oxide resin, a polyetherimide resin, or a fluorine resin may be used. For example, when the resin 132 is formed from a polyimide resin, the resin 132 is cured to form a resin layer formed from a polyimide resin is formed. Note that the number of resin materials used for the resin 132 is not limited to one and a plurality of resin materials may be used.

Note that in this specification, an uncured resin layer and an uncured prepreg refer to both those in an uncured state and those in an incompletely cured state. The latter state is also referred to as a semi-cured state.

As the reinforcing material 131 used for the prepreg 130, fiber, a sheet fibrous body (also referred to as a fibrous sheet), a filler, and the like are given. The sheet fibrous body is a sheet substance formed using fiber and for example, a woven fabric and a nonwoven fabric each correspond to the sheet fibrous body. The way of weaving a woven fabric used for the sheet fibrous body is not particularly limited and for example, a plain-woven fabric, a twilled fabric, a satin-woven fabric, or the like can be used as the sheet fibrous body.

High-strength fiber is preferably used as fiber used for the reinforcing material 131. The high-strength fiber is specifically fiber with a high modulus of elasticity in tension or fiber with a high Young's modulus. As the high-strength fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like are given. As the glass fiber, glass fiber using E glass, S glass, D glass, Q glass, or the like is given. For example, a woven fabric formed from glass fiber is called glass cloth.

There is no particular limitation on a yarn bundle (e.g., the cross-sectional shape or the processing method) used for the reinforcing material 131. The cross-sectional shape may be a circular shape, an elliptical shape, or a flat shape. A sheet fibrous body formed using a yarn bundle which has been subjected to fiber opening is preferably used for the reinforcing material 131 because the yarn bundle subjected to fiber opening has a large width, has a smaller number of single yarns in the thickness direction, and thus is easily flattened in cross section. Flattening the yarn bundle in cross section makes the thickness of the fibrous body small, which reduces the thickness of the reinforcing material 131. Accordingly, the uncured prepreg 130 can be thin.

Figure 1D:
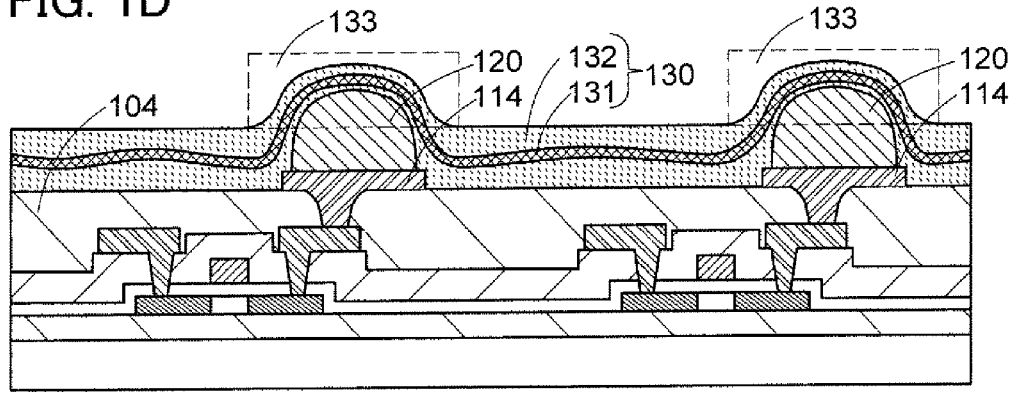
Figure 2A:
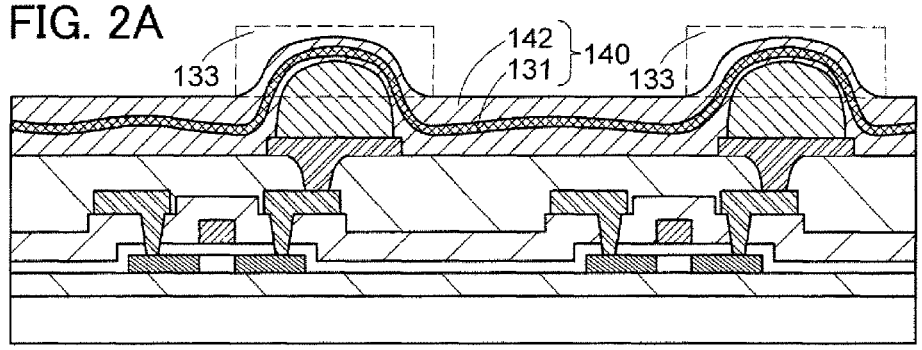
FIGS. 2A to 2D are cross-sectional views illustrating an example of steps following the step in FIG. 1D.

FIG. 1D (Attachment of Prepreg) and FIG. 2A (Curing of Prepreg)

In the case where the resin 132 is a thermosetting resin, a step of closely attaching the prepreg 130 to the surfaces of the insulating film 104 and the protrusions 120 and a step of curing the prepreg 130 can be performed using a vacuum heat press. The prepreg 130 is placed on the insulating film 104 side and the prepreg 130 and the substrate 100 are pressed as illustrated in FIG. 1C, so that the prepreg 130 is closely attached to the surfaces of the insulating film 104 and the protrusions 120 as illustrated in FIG. 1D. The prepreg 130 is heated while being pressed using a vacuum heat press, whereby the prepreg 130 is cured (solidified). Thus, the insulating film 140 including the reinforcing material 131 is formed as illustrated in FIG. 2A. In the insulating film 140, a resin 142 corresponds to the resin 132 which has been cured. Therefore, the insulating film 140 can also be referred to as a resin film including the reinforcing material 131.

In the case where the resin 132 is a photocurable resin, the prepreg 130 may be cured as follows. The prepreg 130 and the substrate 100 are pressed with a vacuum press (or a vacuum heat press), whereby the prepreg 130 is closely attached to the surfaces of the insulating film 104 and the protrusions 120 as illustrated in FIG. 1D. After that, light irradiation is performed.

In this embodiment, as illustrated in FIG. 1D, the prepreg 130 is attached to the substrate 100 with portions of the prepreg 130, which are in regions (regions 133 each surrounded by a dotted line) covering the protrusions 120, protruded as compared to the other region of the prepreg 130. In terms of productivity and reproducibility of this step, the height H (thickness 11) of the protrusion 120 protruded from the top surface of the insulating film 104 is preferably larger than or equal to half the thickness T of the prepreg 130 which has not been subjected to the attachment step (see FIG. 1C). That is, H≧T/2 is preferably satisfied.

Figure 2B:
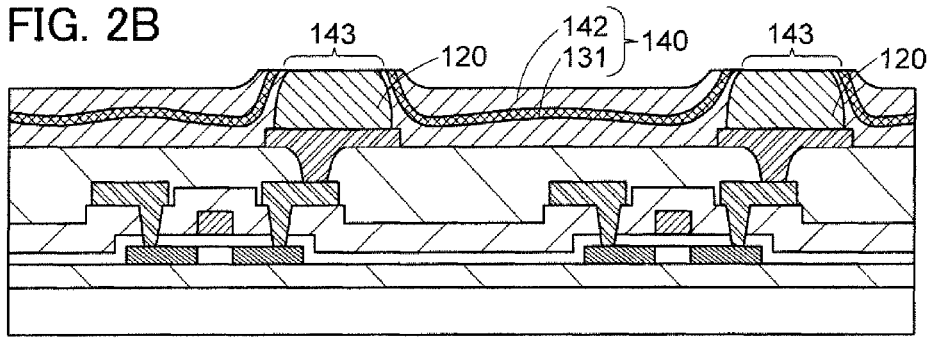

Next, as illustrated in FIG. 2B, protruding portions of the top surface of the insulating film 140 is removed together with protruding portions of the reinforcing material 131, so that openings 143 are formed in the insulating film 140. The openings 143 can be formed by, for example, grinding the insulating film 140 including the reinforcing material 131. As described above, the regions 133 of the insulating film 140, where the protrusions 120 are provided, protrude; thus, by applying a grinding step, the regions of the insulating film 140, which are to be removed to expose the protrusions 120 (the regions 133) can be selectively removed easily. That is, since the positions where the openings 143 are formed in the insulating film 140 are determined in a self-aligned manner depending on the positions of the protrusions 120, the alignment accuracy for formation of the openings 143 is ensured by the alignment accuracy in the step of forming the protrusions 120. Therefore, the skill of the operator is not so important in the grinding step of forming the openings 143 in the insulating film 140 as compared to a step in which a laser beam is used.

In this embodiment, the size and shape of the opening 143 can be controlled by changing the height and shape of the protrusion 120. Thus, instead of the protrusion 120, a protruding conductor like the protrusion 120 may be provided in a region where the opening 143 is to be formed. The conductor thus partly provided with a projecting portion includes a portion forming a terminal of the electronic device and a portion forming an electrode or a wiring.

Grinding treatment in this specification may be any treatment as long as an object can be grinded and includes, in its category, polishing treatment such as mechanical polishing treatment and chemical mechanical polishing treatment, dressing treatment, and lapping treatment.

Figure 3:
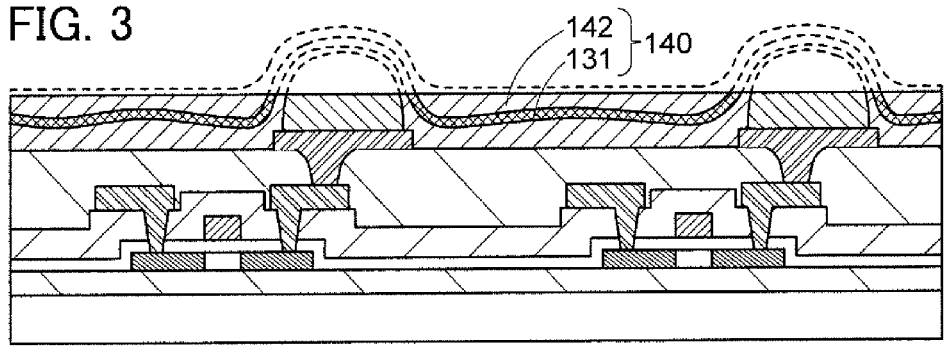
FIG. 3 is a cross-sectional view illustrating another structure example of the step of forming an opening in an insulating film (the step in FIG. 2B).

The step of removing part of the insulating film 140 is not necessarily performed until portions of the insulating film 140, which protrude from the top surface of the insulating film 104, are completely removed. It is only necessary to expose all of the protrusions 120 provided over the substrate 100. For example, as illustrated in FIG. 2B, upper portions of the insulating film 140, which protrude, may be removed in the grinding step. The protrusions 120 may also be grinded when the insulating film 140 is grinded. Alternatively, as illustrated in FIG. 3, the grinding amount may be increased so that a portion of the insulating film 140, which covers a region where the protrusion 120 is not provided, is also removed. In FIG. 3, a portion indicated by a dotted line represents a portion removed in the step of removing the insulating film 140.

By changing the grinding amount, the size of the opening 143 formed in the insulating film 140 (the area of a portion of the protrusion 120, which is exposed from the insulating film 140) can be controlled. Therefore, in this embodiment, variation in area of portions of the protrusions 120, which are exposed from the insulating film 140, can be reduced as compared to the step of forming the openings 143 with the use of a laser beam. Accordingly, variation in electric characteristics of the electronic device can be reduced, which increases reliability of the electronic device itself.

Thus, as the height of the protrusion 120 is increased, the allowable range within which the areas of the plurality of openings 143 on the substrate 100 vary can be broaden. As the size of the substrate is increased, the areas of the openings 143 of the insulating film 140 over the substrate 100 are likely to vary; therefore, increasing the height of the protrusion 120 is advantageously effective. In order to form the plurality of openings 143 in the insulating film 140 reliably, the height of the protrusion 120 may be set to be high and the grinding amount of the protrusion 120 may be increased. Alternatively, without change in the height of the protrusion 120, the grinding amount of the protrusion 120 is increased so that a top surface of the insulating film 140 is entirely grinded as illustrated in FIG. 3, whereby a similar advantageous effect can be obtained.

Figure 2C:
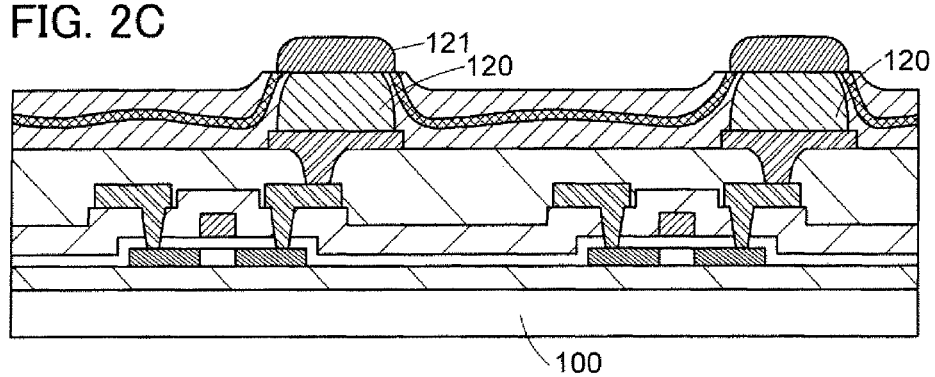

Next, as illustrated in FIG. 2C, conductors 121 are formed to be closely attached to the protrusions 120. The conductor 121 can be formed using a conductive material having fluidity, such as conductive paste containing conductive microparticles or conductive powder or conductive liquid containing conductive microparticles or conductive powder, in a manner similar to that of the protrusion 120 in FIG. 1B. The conductor 121 formed with such a conductive material can be formed in contact with the protrusion 120 with a droplet discharging method (including an ink-jet method, a dispensing method, and the like), a printing method such as a screen printing method, or the like. Then, the conductive material is cured (solidified) with heat treatment, light irradiation, or the like, whereby the conductor 121 is formed.

Thus, in the electronic device, the terminal portion including the protrusion 120 and the conductor 121 is formed. Note that the conductor 121 may include not only a portion forming a terminal portion of the electronic device but also a portion forming a wiring or another electrode.

Note that in the case where electric connection with another electric device is possible with the use of the protrusion 120 without formation of the conductor 121, the conductor 121 is not necessarily formed. By forming the conductor 121, the terminal portion can protrude as compared to any other portion on the insulating film 140 side of the electronic device; therefore, reliability of an electric connection portion with another electric device can be increased, which is preferable.

Figure 2D:
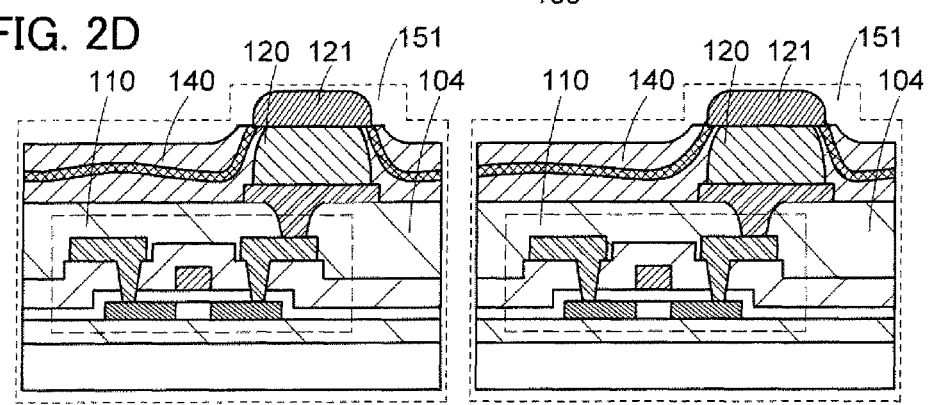

Next, as illustrated in FIG. 2D, a stack formed over the substrate 100 is cut so that individual electronic devices 151 are obtained. This step can be performed with treatment such as dicing or scribing. Before the substrate 100 is cut, the substrate 100 may be thinned by performing grinding treatment or the like.

As illustrated in FIG. 2D, the electronic device 151 includes the one or more electronic elements 110 covered with the insulating film 104, the protrusion 120 and the conductor 121 which are formed over the insulating film 104 and each formed using a conductor electrically connected to at least one of the electronic elements 110, and the insulating film 140 including the reinforcing material 131, which covers the protrusion 120 and the insulating film 104. The insulating film 140 forms a sealing film on the protrusion 120 side of the electronic device 151. The opening 143 is formed in a portion of the insulating film 140, where the protrusion 120 is provided, and the protrusion 120 and the conductor 121 are electrically connected in the opening 143. Thus, the electronic device 151 can be electrically connected to another electronic device (such as an integrated circuit, a wiring circuit, or an antenna) through the conductor 121.

Figure 4A:
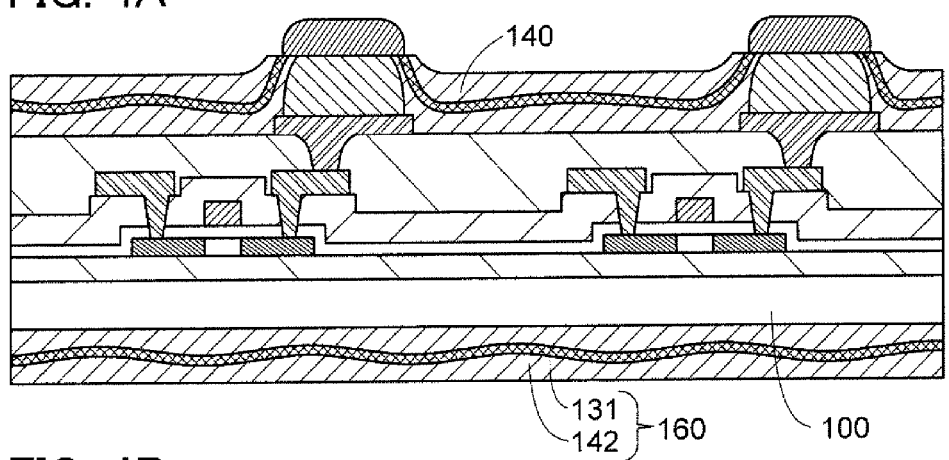
FIGS. 4A and 4B are cross-sectional views illustrating an example of steps following the step in FIG. 2B.
Figure 4B:
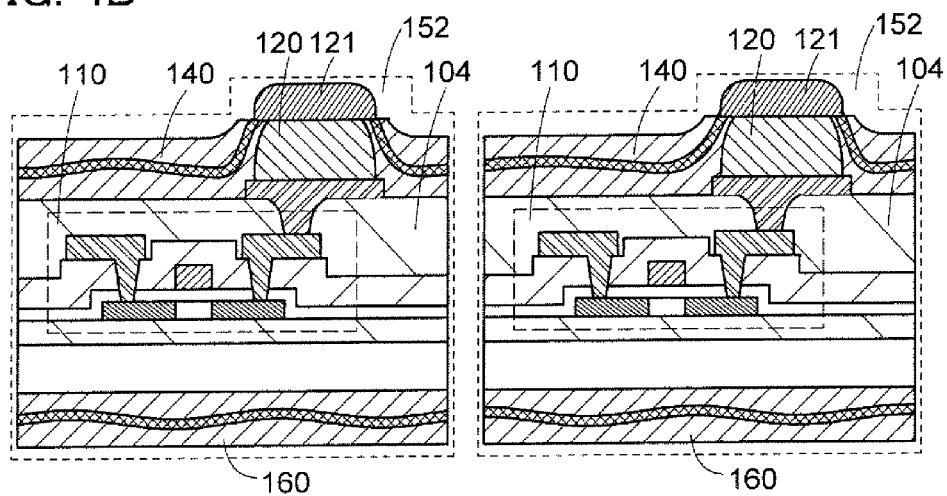

Before the stack formed over the substrate 100 is cut, the prepreg 130 including the reinforcing material 131 may also be attached to a surface of the substrate 100, which is not provided with the stack. After the attachment of the prepreg 130, the prepreg 130 is cured to form an insulating film 160 which covers the surface of the substrate 100, which is not provided with the stack, as illustrated in FIG. 4A. The insulating film 160 is formed from the resin 142 including the reinforcing material 131 in a manner similar to that of the insulating film 140. Note that the insulating film 160 may be formed by curing an uncured resin film which does not include the reinforcing material 131. Then, as illustrated in FIG. 4B, a stack between the insulating film 140 and the insulating film 160 is cut so that individual electronic devices 152 are obtained. The structure of the electronic device 152 is similar to that of the electronic device 151 in FIG. 2D except that the insulating film 160 including the reinforcing material 131 is formed on the rear surface of the substrate 100.

Figure 5A:
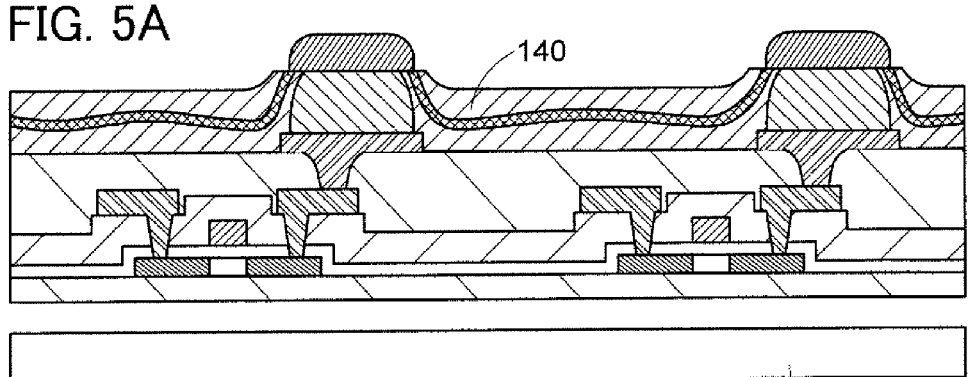
FIGS. 5A to 5C are cross-sectional views illustrating an example of steps following the step in FIG. 2B.
Figure 5B:
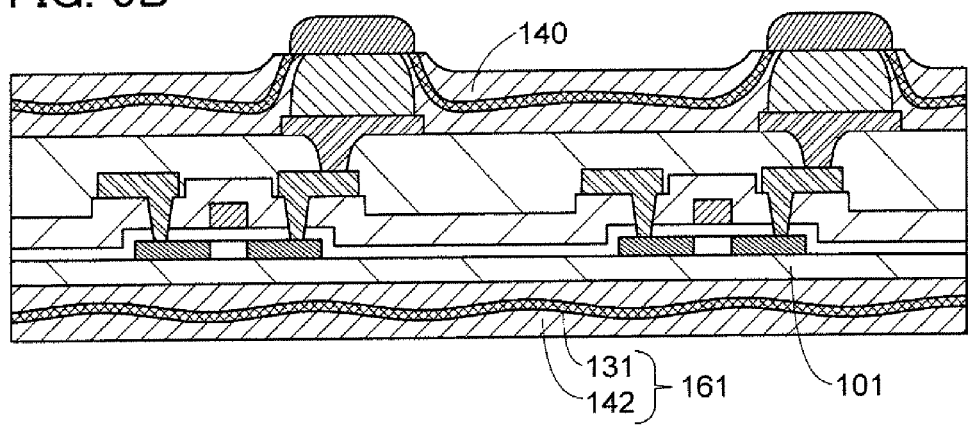

As illustrated in FIG. 5A, the substrate 100 used for manufacture of the electronic element 110 may be separated from the electronic element 110. Then, the prepreg 130 including the reinforcing material 131 is attached to the insulating film 101 and after that, the prepreg is cured to form the insulating film 161 which covers the insulating film 101 (see FIG. 5B). The insulating film 161 is formed from the resin 142 including the reinforcing material 131 in a manner similar to that of the insulating film 140. Note that the insulating film 161 may be formed by curing an uncured resin film which does not include the reinforcing material 131.

Figure 5C:
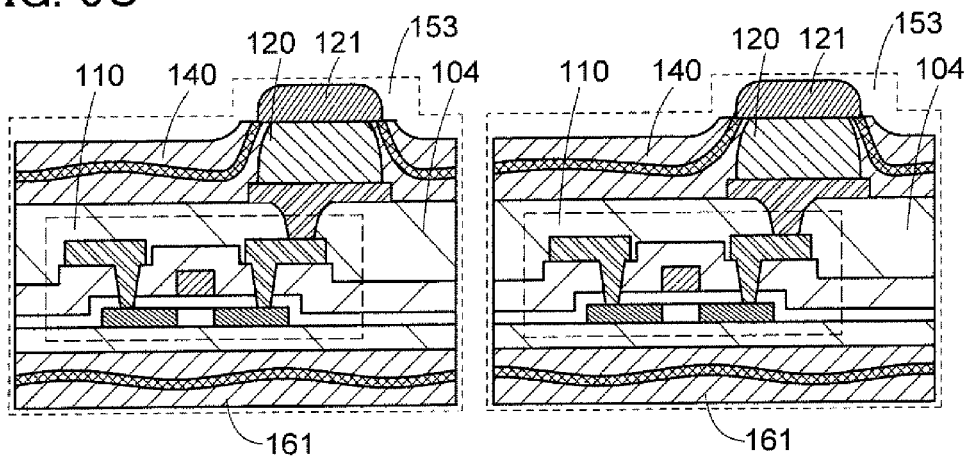

Then, as illustrated in FIG. 5C, a stack between the insulating film 140 and the insulating film 161 is cut so that individual electronic devices 153 are obtained.

The step of separating the substrate 100 may be performed before the openings 143 are formed in the insulating film 140. In that case, steps up to and including the step in FIG. 1A are performed, the substrate 100 is separated, and the insulating film 161 is formed. After that, the openings 143 are formed in the insulating film 140.

The structure of the electronic device 153 is similar to that of the electronic device 151 in FIG. 2D except that the substrate 100 is removed and the insulating film 161 including the reinforcing material 131 is formed on the insulating film 101. The insulating films 140 and 161 function as sealing films of the electronic device 153. By removing the substrate 100, the electronic device 153 which can be curved or bended can be manufactured.

As described above, in this embodiment, accuracy of the position where an opening is formed in an insulating film (resin film) including a reinforcing material is ensured in a self-aligned manner and the shape and size of the opening can be controlled by changing the height and shape of a protrusion. Therefore, by applying this embodiment, the opening can be formed in the insulating film including the reinforcing material with high accuracy and with great ease as compared to the case where a laser beam is used. Accordingly, a terminal structure and an electronic device can have higher reliability.

Note that the method by which an opening is formed in an insulating film formed using a prepreg including a reinforcing material is described in this embodiment; however, this embodiment can also be applied to the case where an opening is formed in an insulating film formed by curing an uncured resin film which does not include a reinforcing material, which brings a similar advantageous effect.

This embodiment can be combined with any of the other embodiments as appropriate.

Embodiment 2

Figure 6:
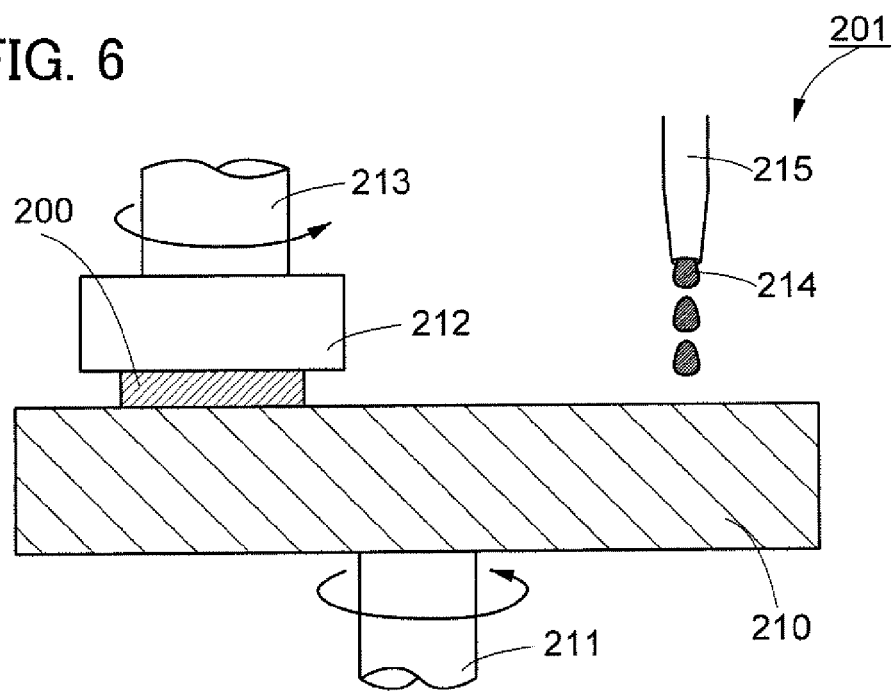
FIG. 6 is a view illustrating an example of a structure of a grinding machine used in a step of forming an opening in an insulating film.
Figure 7:
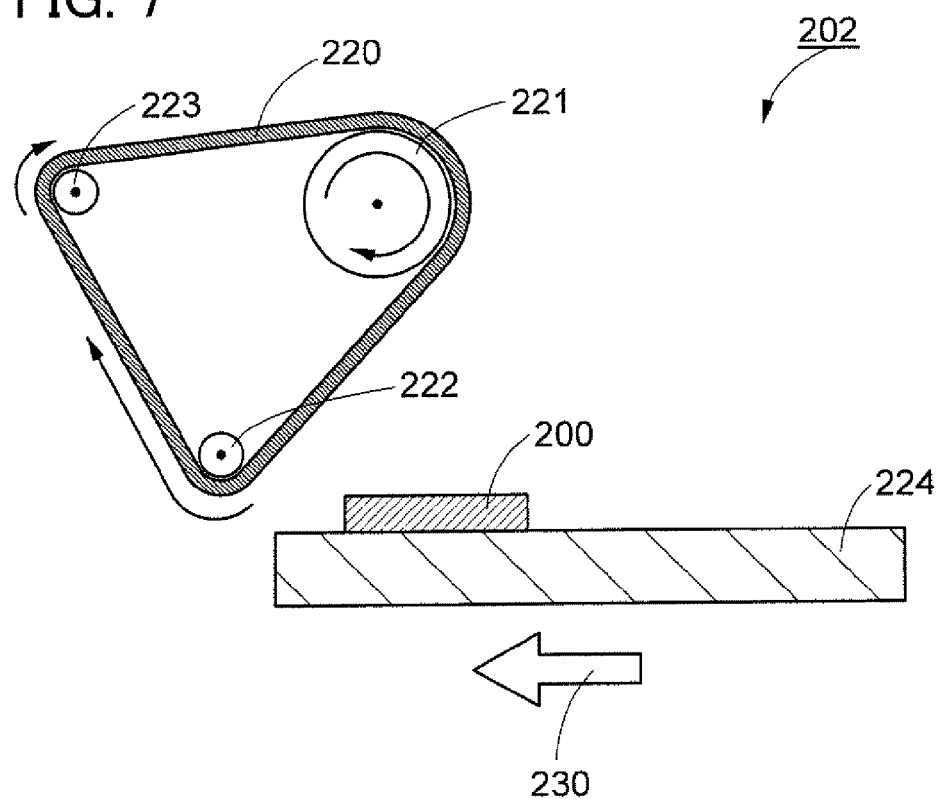
FIG. 7 is a view illustrating an example of a structure of a grinding machine used in a step of forming an opening in an insulating film.

In this embodiment, the step of forming the openings 143 in the insulating film 140 (see FIG. 2B) will be described. FIG. 6 and FIG. 7 are views illustrating examples of structures of grinding machines. The grinding machines in FIG. 6 and FIG. 7 make it possible to preferentially remove a protruding portion of a top surface of the insulating film 140.

[Structure Example 1 of Grinding Machine and Grinding Step]

Hereinafter, a structure of a grinding machine 201 in FIG. 6 and how to use the grinding machine 201 in the step in FIG. 2B will be described.

As illustrated in FIG. 6, the grinding machine 201 includes a grinding surface plate 210 having a grinding surface, a rotating unit 211 which rotates the grinding surface plate 210, a substrate holding unit 212 which holds a processing substrate 200, a rotating unit 213 which rotates the substrate holding unit 212, and a nozzle 215 which supplies liquid 214 to the grinding surface. For example, a sucking chuck can be applied to the substrate holding unit 212 and pure water, slurry, or the like can be used as the liquid 214.

To perform the step in FIG. 2B, first, the processing substrate 200 which has been subjected to the steps up to and including the step in FIG. 2A is fixed to the substrate holding unit 212. The processing substrate 200 is fixed to the substrate holding unit 212 so that a surface of the processing substrate 200, which is on the insulating film 140 side (the side on which a projecting portion is provided), faces the grinding surface plate 210. Then, the insulating film 140 is grinded by being brought into contact with the grinding surface plate 210 which rotates relative to the processing substrate 200. At that time, one of or both the grinding surface plate 210 and the processing substrate 200 may be rotated. To preferentially remove the protruding portion of the insulating film 140, the processing substrate 200 is preferably brought into contact with the grinding surface evenly. Therefore, the processing substrate 200 may be brought into contact with the grinding surface plate 210 by even application of force to the processing substrate 200. Further, the liquid 214 such as pure water may be supplied as needed.

[Structure Example 2 of Grinding Machine and Grinding Step]

Next, a structure of a grinding machine 202 in FIG. 7 and how to use the grinding machine 202 in the step in FIG. 2B will be described.

As illustrated in FIG. 7, the grinding machine 202 includes a grinding belt 220 which has a grinding surface, conveyor rollers 221 to 223 for rotating the grinding belt 220, and a stage 224 for transferring the processing substrate 200. Driving force from a motor or the like is delivered to the conveyor roller 221, and the conveyor roller 221 is rotated by the driving force. The stage 224 has a unit which fixes the processing substrate 200, such as a sucking chuck, and can be transferred in the direction shown by an arrow 230. Further, the grinding machine 202 may be provided with a unit which supplies liquid to the processing substrate 200, like the grinding machine 201.

To perform the step in FIG. 2B, first, the processing substrate 200 which has been subjected to the steps up to and including the step in FIG. 2A is fixed to the stage 224. The processing substrate 200 is fixed to the stage 224 so that the surface of the processing substrate 200, which is on the insulating film 140 side (the side on which a projecting portion is provided), is in contact with the grinding belt 220. Then, the stage 224 is transferred in the direction shown by the arrow 230 so that the grinding belt 220 and the processing substrate 200 are in contact with each other. At that time, the rate at which the stage 224 is transferred and the rate at which the grinding belt 220 is rotated are adjusted so that force is evenly applied to the grinding belt 220 and the processing substrate 200.

In the step in FIG. 2B, the stage 224 may be transferred so that only the protruding region of the insulating film 140 is brought into contact with the grinding belt 220. Since a region to be grinded is the region 133 where part of the insulating film 140 protrudes, a region where the insulating film 140 and the grinding belt 220 are in contact with each other is not necessarily controlled particularly. In that case, the stage 224 may be transferred so that a top surface of the insulating film 140 is entirely brought into contact with the grinding belt 220. In any case, it is only necessary to control the grinding amount and remove part of the insulating film 140 so that the protrusion 120 is exposed.

By forming the protrusion 120, the position of the opening 143 is determined in a self-aligned manner, and the shape and size of the opening 143 can be controlled by changing the shape and height of the protrusion 120. Thus, the opening 143 can be formed in the insulating film 140 with high accuracy with grinding treatment without complex operation of the grinding machine.

Therefore, even when the grinding machine 201 provided with the grinding surface plate 210 rotated in one plane, which is illustrated in FIG. 6, is used, the opening 143 can be formed with high accuracy. When the grinding machine 202 provided with the grinding belt 220 rotated in one plane, which is illustrated in FIG. 7, is used, the stage 224 is just transferred in parallel in a direction shown by the arrow 230, whereby the opening 143 can be formed with high accuracy.

This embodiment can be combined with any of the other embodiments as appropriate.

Embodiment 3

In this embodiment, a sheet fibrous body which can be applied to the reinforcing material 131 of the prepreg 130 illustrated in FIG. 1D will be described. By using the reinforcing material 131 formed using such a sheet fibrous body, the strength of an electronic device can be increased, which is preferable.

[Structure Example 1 of Sheet Fibrous Body]

Figure 8A:
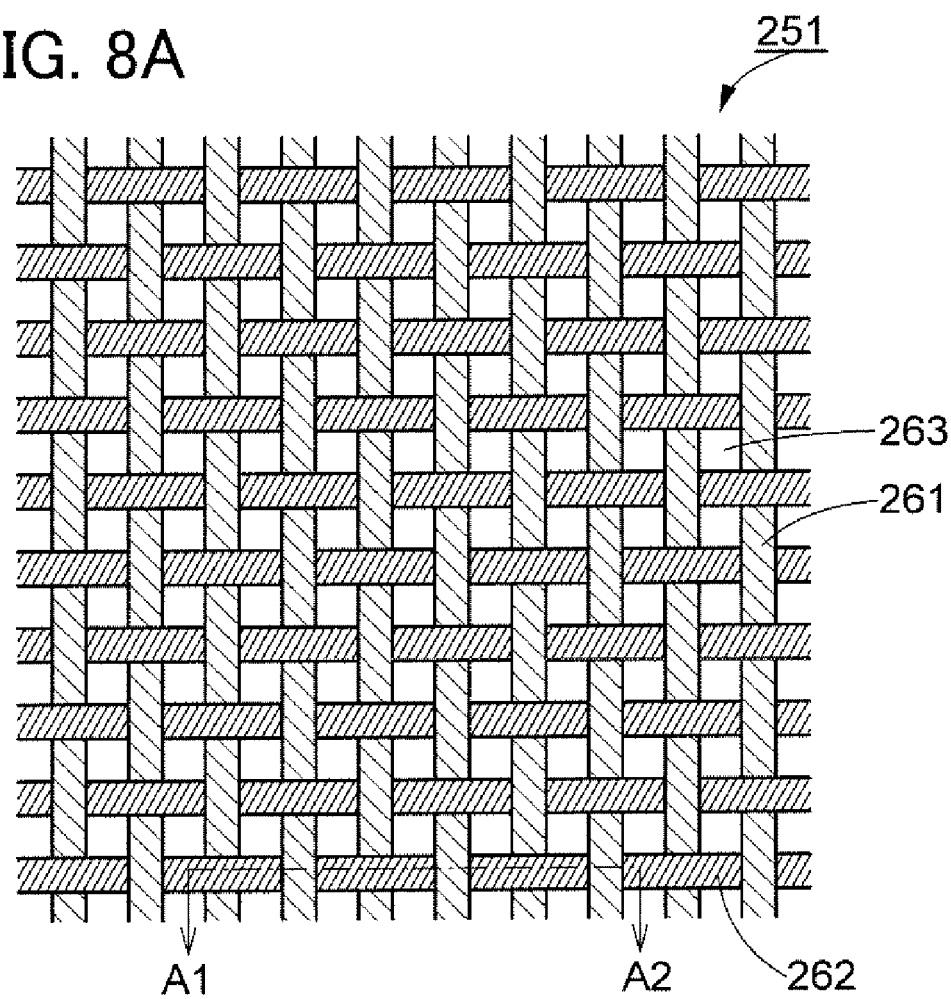
FIG. 8A is a plan view illustrating an example of a structure of a sheet fibrous body in FIG. 1C, which is applied to a prepreg.
Figure 8B:
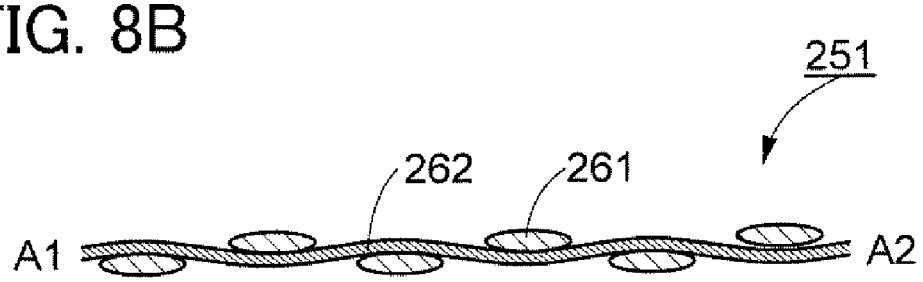
FIG. 8B is a cross-sectional view taken along line A1-A2 in FIG. 8A.

FIG. 8A is a plan view illustrating an example of a structure of the sheet fibrous body 251. FIG. 8B is a cross-sectional view illustrating the example of the structure of the sheet fibrous body 251, which is taken along line A1-A2 in FIG. 8A.

As illustrated in FIG. 8A, the sheet fibrous body 251 is a plain-woven fabric which is obtained by alternately weaving a warp yarn 261 and a weft yarn 262 so that they intersect with each other. The sheet fibrous body 251 has basket holes 263 each of which is a region including neither the warp yarn 261 nor the weft yarn 262.

There is no particular limitation on a yarn bundle (the warp yarn 261 and the weft yarn 262) (e.g., the cross-sectional shape or the processing method) used for the sheet fibrous body 251. The cross-sectional shape may be a circular shape, an elliptical shape, or a flat shape. A yarn bundle which has been subjected to fiber opening is preferably used for the warp yarn 261 and the well yarn 262 because the yarn bundle subjected to fiber opening has a large width, has a smaller number of single yarns in the thickness direction, and thus is easily flattened in cross section. For example, as illustrated in FIG. 8B, by using the warp yarn 261 having a flat cross section and the well yarn 262 having a flat cross section, the sheet fibrous body 251 can be thin.

[Structure Example 2 of Sheet Fibrous Body]

Figure 9:
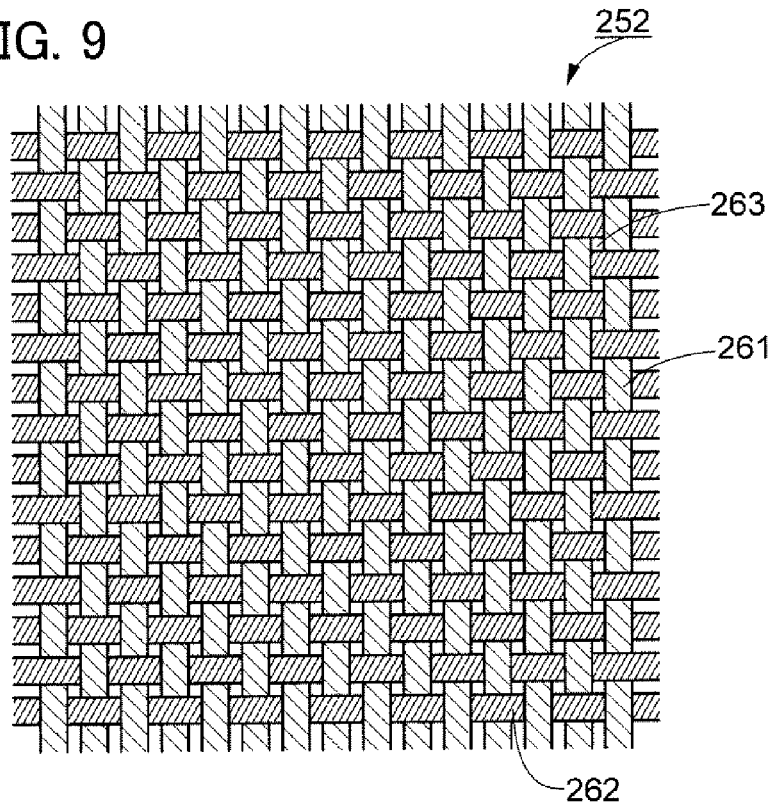
FIG. 9 is a plan view illustrating an example of a structure of a sheet fibrous body in FIG. 1C, which is applied to a prepreg.

As a means to increase the strength of a cured prepreg, reduction in area of a basket hole is given. FIG. 9 illustrates a plan view of a sheet fibrous body 252 having such a structure example. As illustrated in FIG. 9, the sheet fibrous body 252 is a plain-woven fabric which is obtained by alternately weaving a warp yarn 261 and a well yarn 262 so that they intersect with each other, like the sheet fibrous body 251. In the sheet fibrous body 252, the density of the warp yarn 261 and the well yarn 262 is high and the basket hole 263 is small, as compared to the sheet fibrous body 251.

[Structure Example 3 of Sheet Fibrous Body]

Figure 10:
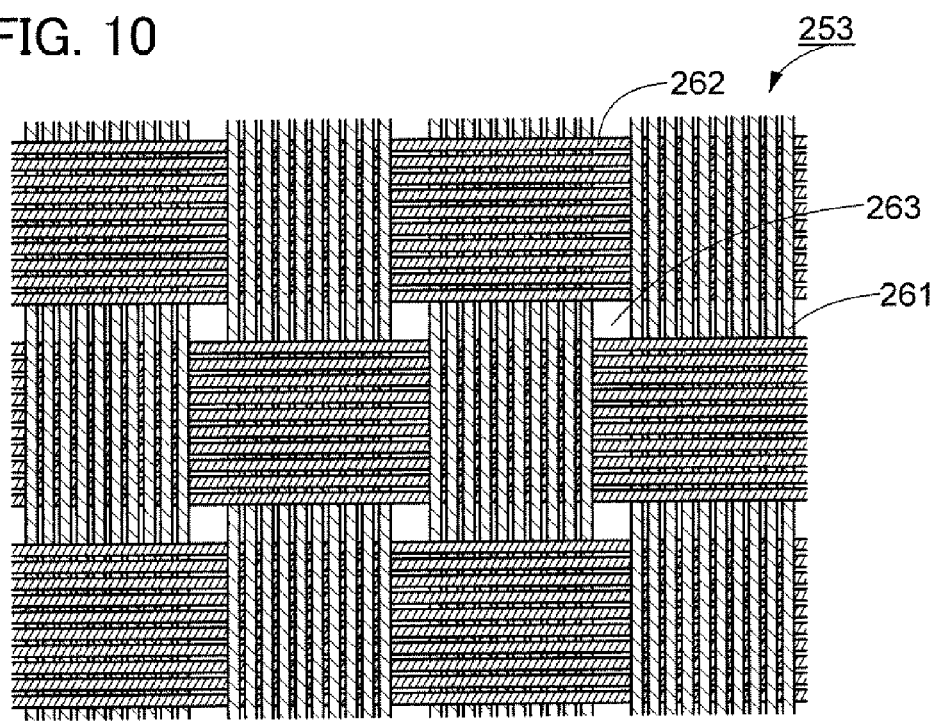
FIG. 10 is a plan view illustrating an example of a structure of a sheet fibrous body in FIG. 1C, which is applied to a prepreg.

A woven fabric used for a sheet fibrous body is not limited to a plain-woven fabric. FIG. 10 illustrates an example of a structure of such a sheet fibrous body. FIG. 10 is a plan view of a sheet fibrous body 253. As illustrated in FIG. 10, the sheet fibrous body 253 is obtained by alternately weaving the ten warp yarns 261 and the ten well yarns 262 so that they intersect with each other.

Further, to protect an electronic device with the use of a cured prepreg more effectively, the area of the basket hole 263 of each of the sheet fibrous bodies (251, 252, and 253) is preferably smaller than the area of a portion of the electronic device, which is locally pressed when the electronic device is used. For example, in the case where the electronic device is pressed with a tool having a sharp tip, like a writing implement such as a pen or a pencil, the shape of the basket hole 263 is preferably a quadrangle having sides each of which has a length of from 0.01 mm to 0.2 mm.

In the step of forming the openings 143 in Embodiment 1, by controlling the grinding amount of the insulating film 140, part of the insulating film 140 can be reliably removed together with part of the reinforcing material 131. Therefore, even when a sheet fibrous body such as glass cloth is used for the reinforcing material 131, the opening 143 can be formed with high productivity.

This embodiment can be combined with any of the other embodiments as appropriate.

Embodiment 4

In this embodiment, as an example, a structure of an electronic device which is capable of transmitting and receiving data through wireless communication and a manufacturing method of the electronic device will be described.

Figure 11:
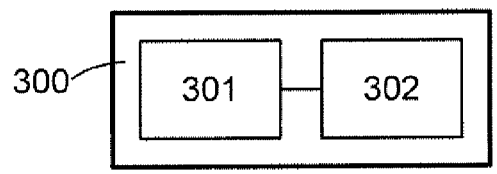
FIG. 11 is a block diagram illustrating an example of a structure of an electronic device according to one embodiment of the present invention.

FIG. 11 is a block diagram illustrating an example of a structure of an electronic device 300 according to this embodiment. As illustrated in FIG. 11, the electronic device 300 includes an antenna 301 and a functional circuit 302 which includes a plurality of electronic elements. The antenna 301 transmits and receives carrier waves. For the antenna 301, the one with a structure suitable for a frequency band in which communication is performed is selected. The functional circuit 302 has at least a function of processing carrier waves which is received by the antenna 301 and/or a function of generating carrier waves which is transmitted from the antenna 301.

Carrier waves are a signal of AC waves which is also referred to as a carrier. In wireless communication, the frequency or amplitude of carrier waves is changed (modulated) in accordance with a signal representing data to generate modulated waves, and data is communicated through transmission and reception of the modulated waves. There are some kinds of methods for modulating carrier waves. A modulation method in which data is represented by the amplitude of carrier waves is called amplitude modulation. A modulation method in which data is represented by the frequency of carrier waves is called frequency modulation.

As a specific example of the electronic device 300, an IC chip (also referred to as a wireless chip) which can communicate data without contact can be given. In addition, a radio frequency identification (RFID) tag with which individual identification without contact is performed can also be given. The RFID tag is also referred to as an RF tag, a wireless tag, an electronic tag, or an IC tag.

Figure 12:
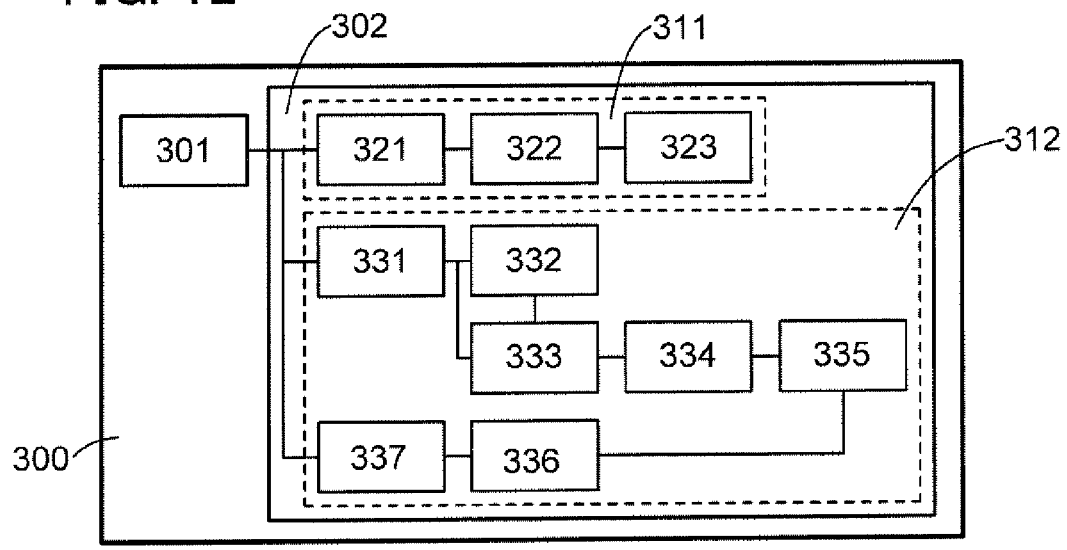
FIG. 12 is a block diagram illustrating an example of a structure of an electronic device according to one embodiment of the present invention.
Figure 13:
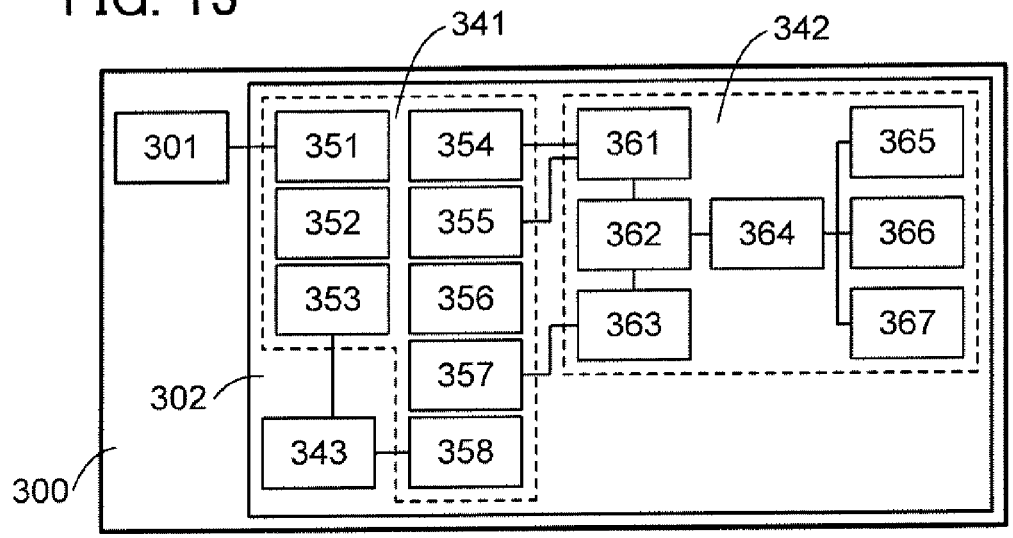
FIG. 13 is a block diagram illustrating an example of a structure of an electronic device according to one embodiment of the present invention.

An example of a structure of the electronic device 300 which can be used for an IC chip or an RFID tag will be described with reference to FIG. 12 and FIG. 13. FIG. 12 is a block diagram illustrating an example of a structure of the electronic device 300 and FIG. 13 is a block diagram illustrating another example of a structure of the electronic device 300.

First, the structure of the electronic device 300 in FIG. 12 will be described. In the electronic device 300 in FIG. 12, the functional circuit 302 can be divided into a power source portion 311 and a logic circuit portion 312 in terms of functions.

The power source portion 311 is a device for supplying power to the electronic device 300 and includes, for example, a rectifier circuit 321, a power storage portion 322, and a constant voltage circuit 323. The rectifier circuit 321 is a circuit to generate a DC voltage from a signal (carrier waves) received by the antenna 301. The power storage portion 322 is a circuit to store the direct-current voltage generated by the rectifier circuit 321 and thus includes, for example, a plurality of capacitors. The constant voltage circuit 323 is a circuit to make the voltage generated by the rectifier circuit 321 constant.

The logic circuit portion 312 has a function of extracting data from the signal (the carrier waves) received by the antenna 301, a function of generating carrier waves, which represents data and is transmitted from the antenna 301, and the like. For example, the logic circuit portion 312 includes a demodulation circuit 331, a clock generation/correction circuit 332, a code recognition/judgment circuit 333, a memory controller 334, a memory device 335, an encoding circuit 336, and a modulation circuit 337.

The demodulation circuit 331 is a circuit to demodulate the carrier waves received by the antenna 301. The clock generation/correction circuit 332 is a circuit to generate a clock signal based on the signal output from the demodulation circuit 331 and to correct the clock signal.

The code recognition/judgment circuit 333 recognizes a code included in the carrier waves received by the antenna 301 and makes a judgment. Further, the code recognition/judgment circuit 333 has a cyclic redundancy check (CRC) function, for discriminating a transmission error. As the code recognized by the code recognition/judgment circuit 333, an end-of-frame (EOF) signal, a start-of-frame (SOF) signal, a flag, a command code, a mask length, a mask value, and the like can be given.

The memory controller 334 generates, based on the code recognized by the code recognition/judgment circuit 333, a signal for reading out data from the memory device 335. The memory device 335 includes at least a read-only memory (ROM). As an example of the ROM, a mask ROM and a PROM can be given. Further, the memory device 335 may include a memory circuit such as a random access memory (RAM), which is capable of rewriting data. As the memory circuit capable of rewriting data, for example, a DRAM, an SRAM, an FeRAM, an EEPROM, or a flash memory can be used.

The encoding circuit 336 encodes data which is to be transmitted from the electronic device 300, such as data read out from the memory device 335, or the like. The modulation circuit 337 modulates the signal based on the data which has been encoded in the encode circuit 336 to generate carrier waves which can be transmitted from the antenna 301.

Next, the structure of the electronic device 300 in FIG. 13 will be described. The electronic device 300 functions as an arithmetic processing unit which operates through wireless communication with an external device. In the electronic device 300 in FIG. 13, the functional circuit 302 can be divided into an analog circuit portion 341, a digital circuit portion 342, and a power storage portion 343 in terms of functions.

The analog circuit portion 341 includes a resonance circuit 351 having a resonant capacitor, a constant voltage circuit 352, a rectifier circuit 353, a demodulation circuit 354, a modulation circuit 355, a reset circuit 356, an oscillator circuit 357, and a power supply control circuit 358.

The digital circuit portion 342 includes an RF interface 361, a control register 362, a clock controller 363, a central processing unit (CPU) 364, a CPU interface 365, an RAM 366, and an ROM 367.

The operation of the electronic device 300 in FIG. 13 is roughly described below. A signal (carrier waves) received by the antenna 301 is input to the analog circuit portion 341 and an induced electromotive force is generated in the resonance circuit 351. The induced electromotive force is stored in the power storage portion 343 via the rectifier circuit 353. The power storage portion 343 can be formed using a capacitor such as a ceramic capacitor or an electric double layer capacitor.

The reset circuit 356 generates a signal which resets and initializes the digital circuit portion 342. For example, the reset circuit 356 generates a signal which rises after increase in a power supply voltage with delay as a reset signal. The oscillator circuit 357 changes the frequency and the duty ratio of a clock signal in accordance with a control signal generated by the constant voltage circuit 352. The demodulation circuit 354 is a circuit which demodulates a received signal, and the modulation circuit 355 is a circuit which modulates a signal so that data to be transmitted is included in carrier waves.

For example, when a modulation method by which a signal is processed in the electronic device 300 is an amplitude shift keying (ASK) method, which is one of amplitude modulation methods, the demodulation circuit 354 is preferably formed using a low-pass filter. The demodulation circuit 354 binarizes the received signal based on variation in amplitude. On the other hand, the modulation circuit 355 changes the resonance point of the resonance circuit 351, thereby changing the amplitude of the signal.

The clock controller 363 generates a control signal for changing the frequency and the duty ratio of a clock signal in accordance with a power supply voltage or a current consumed in the CPU 364. The power supply voltage is monitored by the power supply control circuit 358.

The signal received by the antenna 301 is demodulated by the demodulation circuit 354. The demodulated signal is decomposed into a control command, data, and the like by the RF interface 361. The control command is stored in the control register 362. The control command includes an instruction to a circuit included in the digital circuit portion 342, such as an instruction for reading out data from the ROM 367, an instruction for writing data to the RAM 366, or an arithmetic instruction to the CPU 364.

The CPU 364 accesses the ROM 367, the RAM 366, and the control register 362 via the CPU interface 365. The CPU interface 365 generates an access signal which allows the CPU 364 to access any of the ROM 367, the RAM 366, and the control register 362 in accordance with an address requested by the CPU 364.

There are several arithmetic processing methods of the CPU 364, and a method in which processing is performed by software is one of the methods. In this method, for example, the ROM 367 stores an operating system (OS) and the CPU 364 reads out a program stored in the ROM 367 to execute. Another method is a method in which processing is conducted by a dedicated arithmetic circuit, that is, a method in which processing is conducted by hardware. Another method is a method in which hardware and software are used. In this method, part of arithmetic processing is conducted by a dedicated arithmetic circuit and the other part of the arithmetic processing is conducted by the CPU 364 with the use of a program.

Next, an example of a method for manufacturing the electronic device 300 will be described. This embodiment will describe a manufacturing method including a step of separating a substrate which is used for manufacturing an electronic device. For example, in the manufacturing method described in Embodiment 1 as such a method, a separation film (e.g., a film including silicon) is formed between the substrate 100 and the insulating film 101 serving as a base and removed by etching, so that the electronic device can be separated from the substrate 100. Alternatively, the electronic device may be separated from the substrate 100 in such a manner that a separation film which includes a metal as its main component is formed between the substrate 100 and the insulating film 101 serving as a base and physical force is applied to the separation film in order to cause separation along the separation film.

An example of the manufacturing method of the electronic device 300, to which the latter method is applied, will be described below with reference to FIGS. 14A to 14C, FIGS. 15A and 15B, FIGS. 16A and 16B, FIG. 17, and FIGS. 18A to 18D.

First, as illustrated in FIG. 14A, a substrate for manufacturing an electronic element of the functional circuit 302 is prepared. Here, as the substrate, a glass substrate 400 is used. The functional circuit 302 is formed over a base insulating film 401 which is formed over the glass substrate 400. A separation film 402 is formed between the base insulating film 401 and the glass substrate 400 so that the functional circuit 302 is separated from the glass substrate 400 after the functional circuit 302 is manufactured.

Before the separation film 402 is formed, a base film 403 is formed on and in close contact with the glass substrate 400. The base film 403 is a base film of the separation film 402 and is formed in order to improve adhesion between the separation film 402 and the glass substrate 400. The base film 403 can be formed using an insulating film with a single-layer structure or a layered structure. As the insulating film used to form the base film 403, a silicon oxide film, a silicon oxynitride film, a silicon nitride oxide film, a silicon nitride film, a metal oxide film, or the like can be used. Here, a silicon oxynitride film with a thickness of 100 nm is formed with a PECVD method.

Next, the separation film 402 is formed in contact with the base film 403. Here, as the separation film 402, a tungsten film with a thickness of 50 nm is formed with a sputtering method.

In this manufacturing method, separation is caused priorly inside the separation film 402 and/or at the interface between the separation film 402 and the base insulating film 401 by applying mechanical force to the separation film 402 so that the functional circuit 302 is separated from the glass substrate 400. In order that such separation may be caused, the separation film 402 is formed using a tungsten film, a molybdenum film, an alloy film of tungsten and molybdenum, an oxide film of tungsten and/or molybdenum, an oxynitride film of tungsten and/or molybdenum, a nitride oxide film of tungsten and/or molybdenum, or a nitride film of tungsten and/or molybdenum, for example. Further, the separation film 402 can be formed using a stack of films selected from the above. These films can be formed with a sputtering method, a PECVD method, a droplet discharging method, or the like.

The separation film 402 may be formed in such a manner that a tungsten film, a molybdenum film, or an alloy film of tungsten and molybdenum is formed as a first layer and an oxide film, an oxynitride film, a nitride oxide film, or a nitride film of the first layer is formed as a second layer. Alternatively, the separation film 402 may be formed in such a manner that a tungsten film, a molybdenum film, or an alloy film of tungsten and molybdenum is formed over the base film 403 and the film is subjected to oxidation treatment. As the oxidation treatment, thermal oxidation treatment, plasma oxidation treatment with oxygen or $N_2O$ plasma, surface treatment with a solution having strong oxidizing power, such as ozone water, or the like can be used.

Next, the base insulating film 401 with a single-layer structure or a stacked-layer structure is formed in contact with the separation film 402. An insulating film which can endure later steps of manufacturing the electronic device 300 is selected as the base insulating film 401 and can be formed in a manner similar to that of the insulating film 101 in FIG. 1A. Here, the base insulating film 401 has a three-layer structure; a silicon oxynitride film with a thickness of 100 nm to 700 nm is formed as a first layer, a silicon nitride oxide film with a thickness of 20 nm to 100 nm is formed as a second layer, and a silicon oxynitride film with a thickness of 50 nm to 150 nm is formed as a third layer. These films are formed by a PECVD method.

Next, the functional circuit 302 is manufactured over the base insulating film 401. A plurality of functional circuits 302 is simultaneously manufactured over the glass substrate 400 in the same process. A process of manufacturing two functional circuits 302 each including an n-channel transistor and a p-channel transistor is illustrated in drawings.

As illustrated in FIG. 14B, a semiconductor film 405 is formed over the base insulating film 401 in order to manufacture the functional circuits 302. Here, a crystalline silicon film is formed as the semiconductor film 405. For example, the crystalline silicon film can be formed in such a manner that an amorphous silicon film with a thickness of 40 nm to 80 nm is formed with a PECVD method using a mixed gas of $H_2$ and $SiH_4$ and then the amorphous silicon film is crystallized by irradiation with a second harmonic of an Nd:YVO$_4$ laser (a fundamental wave of 1064 nm). Alternatively, the amorphous silicon film may be crystallized with thermal treatment in a heating furnace.

Next, a resist mask is formed over the semiconductor film 405 and the semiconductor film 405 is etched to have a desired shape using the resist mask, so that semiconductor films 420 and semiconductor films 430 are formed over the base insulating film 401 as illustrated in FIG. 14C. The semiconductor films 420 are semiconductor layers of the n-channel transistors and the semiconductor films 430 are semiconductor layers of the p-channel transistors. After the resist mask used to etch the semiconductor film 405 is removed, if needed, an impurity element serving as a donor or acceptor is added to the semiconductor films 420 and/or the semiconductor films 430 in order to control the threshold voltage of the transistors. Alternatively, the step of adding an impurity element may be performed before the semiconductor film 405 is etched and may be performed as necessary in a later step.

Next, as illustrated in FIG. 14C, an insulating film 406 is formed so as to cover the semiconductor films 420 and the semiconductor films 430. The insulating film 406 serves as a gate insulating film of each of the transistors. The insulating film 406 can be formed in a manner similar to that of the insulating film 102 in FIG. 2A. Here, a silicon oxynitride film with a thickness of 10 nm to 100 nm is formed with a PECVD method. Further, after an insulating film is formed with a PECVD method or the like, the insulating film may be subjected to nitriding treatment with microwave-exited high-density plasma.

Next, as illustrated in FIG. 14C, conductive films 441 and conductive films 442 are formed over the insulating film 406. The conductive films 441 form gate electrodes (or gate wirings) of the n-channel transistors and the conductive films 442 form gate electrodes (or gate wirings) of the p-channel transistors. Here, each of the conductive films 441 and 442 is formed to have a two-layer structure. First, a tantalum nitride film with a thickness of 20 nm to 50 nm is formed over the insulating film 406 with a sputtering method and then a tungsten film with a thickness of 100 nm to 300 nm is formed over the tantalum nitride film with a sputtering method. Next, a resist mask is formed over the tungsten film. The stack of the tantalum nitride film and the tungsten film is etched with the use of the resist mask, so that the conductive films 441 and 442 are formed.

Next, as illustrated in FIG. 14D, n-type low-concentration impurity regions 423 are formed in the semiconductor films 420 and p-type high-concentration impurity regions 432 are formed in the semiconductor films 430. The n-type low-concentration impurity regions 423 form high-resistance regions of the n-channel transistors and the p-type high-concentration impurity regions 432 function as source and drain regions of the p-channel transistors.

In order to form these regions, first, resist masks which cover the semiconductor films 430 are formed. An impurity element which imparts n-type conductivity is added to the semiconductor films 420 with the use of the conductive films 441 as masks, so that the n-type low-concentration impurity regions 423 are formed in the semiconductor films 420. Regions in the semiconductor films 420, where the impurity element is not added in this step, become channel formation regions 421. Then, after the resist masks which cover the semiconductor films 430 are removed, resist masks which cover the semiconductor films 420 are formed. An impurity element which imparts p-type conductivity is added to the semiconductor films 430 with the use of the conductive films 442 as masks, so that the p-type high-concentration impurity regions 432 are formed in the semiconductor films 430. Then, the resist masks are removed. Regions in the semiconductor films 430, where the impurity element is not added in the step of adding the impurity element, become channel formation regions 431.

As for the steps illustrated in FIG. 14D, the p-type high-concentration impurity regions 432 may be formed first and then the n-type low-concentration impurity regions 423 may be formed.

In this embodiment, phosphorus (P), arsenic (As), or the like can be used as the impurity element which imparts n-type conductivity, and boron (B), aluminum (Al), gallium (Ga), or the like can be used as the impurity element which imparts p-type conductivity.

Next, as illustrated in FIG. 15A, an insulating film 407 is formed so as to cover the insulating film 406, the conductive films 441, and the conductive films 442. The insulating film 407 can be formed in a manner similar to that of the insulating film 103 in FIG. 1A. Here, the insulating film 407 is formed to have a two-layer structure; a silicon oxide film with a thickness of 50 nm to 150 nm is formed as a first layer with a PECVD method, and a low temperature oxide (LTO) film with a thickness of 100 nm to 250 nm is formed as a second layer with a thermal CVD method which is performed at a process temperature of 200° C. to 500° C.

Next, the insulating film 407 and the insulating film 406 are subjected to etching. This etching step is performed by anisotropic etching mainly in a perpendicular direction. By such anisotropic etching, sidewalls formed using the insulating film 407 can be formed on side surfaces of the conductive films 441 and the conductive films 442 as illustrated in FIG. 15B. Further, regions of the insulating film 406, which are covered with the conductive films 441, the conductive films 442, and the insulating films 407, are left in this etching step and the other regions of the insulating film 406 are removed.

Next, as illustrated in FIG. 15C, n-type high-concentration impurity regions 422 serving as source and drain regions are formed in the semiconductor films 420. First, resist masks which cover the semiconductor films 430 are formed, and then an impurity element which imparts n-type conductivity is added to the semiconductor films 420. In this step of adding the impurity element, the conductive films 441 and the insulating films 407 serve as masks, the n-type high-concentration impurity regions 422 are formed in the semiconductor films 420 in a self-aligned manner, and the n-type low-concentration impurity regions 423 formed in the step illustrated in FIG. 14D are left in portions overlapping with the insulating films 407.

Next, as illustrated in FIG. 15D, an insulating film 408 is formed so as to cover the semiconductor films 420, the semiconductor films 430, the conductive films 441, and the conductive films 442. Then, conductive films 443 to 445 are formed over the insulating film 408.

The insulating film 408 can be formed in a manner similar to that of the insulating film 103 in FIG. 1A. Here, the insulating film 408 is formed to have a three-layer structure. First, as a first layer, a silicon oxynitride film with a thickness of 20 nm to 100 nm is formed with a PECVD method. After that, heat treatment is performed to activate the impurity elements added to the semiconductor films 420 and the semiconductor films 430. Then, as a second layer, a silicon nitride oxide film with a thickness of 100 nm to 300 nm is formed with a PECVD method, and as a third layer, a silicon oxynitride film with a thickness of 200 nm to 1 μm is formed with a PECVD method.

Next, in order that the conductive films 443 and the conductive films 444 are electrically connected to the n-type high-concentration impurity regions 422 and the p-type high-concentration impurity regions 432, respectively, the insulating film 408 is etched so that openings are formed. Then, a conductive film to be the conductive films 443 to 445 is formed over the insulating film 408. The conductive film can be formed in a manner similar to that of the conductive film 113 in FIG. 1A. Here, as the conductive film, a conductive film with three layers is formed with a sputtering method. A first layer is a titanium film with a thickness of 50 nm to 150 nm, a second layer is a pure aluminum film with a thickness of 200 nm to 400 nm, and a third layer is a titanium film which is the same as the first layer. Then, a resist mask is formed over the conductive film with a three-layer structure and the conductive film is etched using the resist mask, so that the conductive films 443 to 445 are formed.

The conductive films 443 are electrically connected to the n-type high-concentration impurity regions 422 and each of them functions as a source electrode, a source wiring, a drain electrode, or a drain wiring of the n-channel transistor. The conductive films 444 are electrically connected to the p-type high-concentration impurity regions 432 and each of them functions as a source electrode, a source wiring, a drain electrode, or a drain wiring of the p-channel transistor. Further, the conductive film 445 forms a portion in which the functional circuit 302 and the antenna 301 are electrically connected to each other.

Through the above steps, electronic elements (n-channel transistors 491 and p-channel transistors 492) of the functional circuits 302 are completed. Next, an example of steps of forming a connection terminal of the functional circuit 302 and the antenna 301 is described with reference to FIGS. 16A to 16C and FIG. 17A.

As illustrated in FIG. 16A, an insulating film 409 is formed so as to cover the conductive films 443 to 445. Here, the insulating film 409 is formed to have a two-layer structure. A dense insulating film is formed as a first layer in order to protect the electronic elements of the functional circuits 302. Here, a silicon nitride film with a thickness of 50 nm to 200 nm is formed as a first layer with a PECVD method. As a second layer, a resin film (e.g., a polyimide film) with a thickness of 1 μm to 3 μm is formed using a photosensitive resin material in order to flatten an upper surface of the functional circuits 302. Openings are formed in portions of the resin film, which correspond to the conductive films 445, with exposure treatment. Then, the silicon nitride film of the first layer is subjected to etching so that openings are formed in portions overlapping with the openings in the resin film.

Next, conductive films 451 which are electrically connected to the conductive films 445 are formed over the insulating film 409 and protrusions 452 are formed corresponding to the conductive films 451. Here, as the conductive films 451, a titanium film with a thickness of 100 nm to 300 nm is formed with a sputtering method.

Protrusions 452 can be formed in a manner similar to that of the protrusions 120 in FIG. 1B. Here, the conductive films 451 are coated with silver paste with a screen printing method. Then, the silver paste is baked, so that the protrusions 452 including silver are formed. The protrusions 452 are the most protruding portions over the glass substrate 400. The protrusion 452 can also be referred to as a conductor having a projecting portion.

The conductive film 445, the conductive film 451, and the protrusion 452 form a terminal portion 450 of the functional circuit 302. Note that the terminal portion 450 may be formed using only the protrusion 452 without forming the conductive film 451.

Next, a prepreg 460 formed using an uncured resin 462 which includes a reinforcing material 461 is prepared. The one which is similar to the prepreg 130 in FIG. 1C can be used as the prepreg 460. The prepreg 460 preferably has a thickness of 10 μm to 100 μm when it is cured. This is for protecting of the functional circuit 302 and for giving flexibility to the functional circuit 302 with the prepreg 460 which has not been cured. Further, in order that the protrusion 452 may be formed so that the height of the protrusion 452 may be half the thickness of the prepreg 460 or more and in order that the functional circuit 302 may be made thin, the cured prepreg 460 preferably has a thickness of 10 μm to 30 μm.

Then, as illustrated in FIG. 16B, the prepreg 460 is provided on an insulating film 409 side of the electronic device and the prepreg 460 is closely attached to the insulating film 409, the conductive films 451, and the protrusions 452. In the prepreg 460, portions in regions 464, which cover the protrusions 452, protrude as compared to portions in the other regions, because of the protrusions 452.

The prepreg 460 is cured in such a state, so that an insulating film 465 including the reinforcing material 461 is formed as illustrated in FIG. 16C. In the insulating film 465, the resin 463 corresponds to the resin 462 which has been cured. That is, the insulating film 465 can also be referred to as a resin film including the reinforcing material 461. Further, the insulating film 465 functions as a sealing film of the functional circuits 302.

Here, a sheet-like fibrous body including a glass fiber is used for the reinforcing material 461 of the prepreg 460 and a thermosetting resin is used for a resin material of the resin 462 of the prepreg 460. The steps illustrated in FIGS. 16B and 16C are performed as a series of steps using a vacuum heat press. That is, the prepreg 460 is pressed against the glass substrate 400 by the vacuum heat press while the prepreg 460 is stacked on the insulating film 409 side, and then the prepreg 460 is cured (solidified) to form the insulating film 465.

Next, portions of the insulating film 465, which are in the regions 464 and cover the protrusions 452, are removed. As a result, openings 466 are formed in the regions 464 so that the protrusions 452 (the terminal portions 450) are exposed as illustrated in FIG. 17A. Since the portions of the insulating film 465, which are in the regions 464, protrude as compared to portions in the other regions, this step can be performed in a manner similar to that of the step in FIG. 2B and is preferably performed with grinding treatment. Further, the grinding methods described in Embodiment 2 can be employed. Alternatively, a conductor may be formed in close contact with the protrusion 452 by performing a step similar to that in FIG. 2C.

In this embodiment, a laser beam is not used for formation of the openings 466 in the insulating film 465, whereby the functional circuit 302 is not damaged by a laser beam. Accordingly, miniaturization and high performance of the electronic elements of the functional circuit 302 are easily achieved. Thus, the functional circuit 302 including the CPU 364 illustrated in FIG. 13, which is a high performance circuit, can be manufactured with a high yield.

Through the above steps, the functional circuits 302 each provided with a terminal portion 450 are manufactured. Next, a step of separating the functional circuits 302 from the glass substrate 400 is performed. This separation step can be performed as follows, for example.

Irradiation with a UV laser beam is performed from an insulating film 465 side so that a groove (not illustrated) is formed in a stack over the glass substrate 400 so as to reach the separation film 402. By formation of the groove, separation is caused inside the separation film 402 and/or at the interface between the base insulating film 401 and the separation film 402. Accordingly, the plurality of functional circuits 302 can be separated from the glass substrate 400 with relatively weak force (force that can be applied by a hand). Next, as illustrated in FIG. 17B, a heat separation-type adhesive film 470 (hereinafter referred to as the "film 470") which is formed using a resin film such as a polyethylene terephthalate (PET) film is attached to the insulating film 465. Then, as illustrated in FIG. 17B, the stack over the base insulating film 401 is separated from the glass substrate 400. This separation step can be performed using, for example, a separating apparatus provided with a winding roller. Alternatively, the separation step can be performed by a hand or by pulling of the film 470 with a pair of tweezers.

Next, in order to protect the base insulating film 401 which is exposed due to removal of the glass substrate 400, a protective film which is formed using a prepreg including a reinforcing material is formed. Further, for formation of the protective film, the one which is similar to the prepreg 460 used for forming the insulating film 465 can be used. The prepreg 460 which has not been cured is attached to the base insulating film 401, and the prepreg 460 is cured by a vacuum heat press with the prepreg 460 closely attached to the base insulating film 401. As a result, as illustrated in FIG. 18A, an insulating film 467 including a reinforcing material 461 is formed on the base insulating film 401 side. The insulating film 467 is a resin film including the reinforcing material 461 and functions as a sealing film of the functional circuit 302.

Next, the stack held by the film 470 is divided into the individual functional circuit 302. This step can be performed by dicing, scribing, or the like. Here, scribing with the use of a UV laser beam is performed. Irradiation with a UV laser beam is performed from the insulating film 467 side, so that a groove is formed in the stack held by the film 470. As illustrated in FIG. 18B, by forming the groove, the plurality of functional circuits 302 held by the film 470 is formed. In order to separate the functional circuits 302 from the film 470, the film 470 may be heated so that adhesiveness of the film 470 is decreased.

Next, the antenna 301 is electrically connected to the functional circuit 302. Here, as the antenna 301, a film antenna including a film 500 formed using a resin such as polyester and a conductive film 501 formed over the film 500 is used. As the film 500, a film which has flexibility and is formed using an insulating material is preferably used. Since the functional circuit 302 has a structure in which the electronic elements are sealed with the insulating film 465 and the insulating film 467 each of which is formed using a resin, the functional circuit 302 is flexible and bendable. Therefore, when the antenna 301 is formed using a film antenna which is bendable, the electronic device 300 in FIG. 19A can also be flexible.

For example, as the film 500, a resin film such as a polyester film, a polycarbonate film, an acrylic film, or a polyimide film can be used. The conductive film 501 includes a portion forming a main body of the antenna and a terminal portion which is electrically connected to the functional circuit 302. A surface of the conductive film 501 is covered with a layer formed using an insulating material such as a resin, except for the terminal portion.

As illustrated in FIG. 19A, the conductive film 501 of the antenna 301 and the terminal portion 450 (the protrusion 452) of the functional circuit 302 are electrically connected to each other. Here, the conductive film 501 and the protrusion 452 are electrically connected to each other using a conductor 510 formed using conductive paste. Needless to say, a means for connecting the conductive film 501 and the protrusion 452 is not limited to the conductive paste. A practitioner can select the means as appropriate in consideration of structures (e.g., shapes, materials, or manufacturing methods) of the conductive film 501 and the protrusion 452. For example, it is possible to form the conductor 510 using an anisotropic conductive film or solder paste. Alternatively, the protrusion 452 and the conductive film 501 may be closely attached to each other by ultrasonic bonding, thermocompression bonding, or the like without forming the conductor 510.

FIGS. 19B to 19D

The conductive film 501 may have a suitable structure (e.g., a shape, a size) in accordance with the frequency band of carrier waves transmitted and received by the electronic device 300, the communication distance, or the like. Three example of the structure of the antenna 301 (the conductive film 501) are described with reference to FIGS. 19B to 19D.

For example, when the frequency band is from the 125 kHz band to the 135 kHz band or the 13.56 MHz band, a loop antenna, a coil antenna, or a spiral antenna may be used as the antenna 301. FIG. 19B illustrates a plan view of the electronic device 300 in which a loop antenna is applied to the antenna 301. In addition, FIGS. 19C and 19D illustrate a structural example of the electronic device 300 used in the UHF band (860 to 960 MHz band) and a structural example of the electronic device 300 used in the 2.45 GHz band, respectively. The antenna 301 of the electronic device 300 in FIG. 19C is a dipole antenna and the antenna 301 of the electronic device 300 in FIG. 19D is a patch antenna.

In this embodiment, a laser beam is not used for formation of the openings 466 in the insulating film 465, whereby the functional circuit 302 is not damaged by a laser beam. Accordingly, miniaturization and high performance of the electronic elements of the functional circuit 302 are easily achieved. Thus, the functional circuit 302 including the CPU 364 illustrated in FIG. 13, which is a high performance circuit, can be manufactured with a high yield.

In addition, the electronic device 300 of this embodiment may be embedded in paper or interposed between two plastic substrates, whereby an IC card can be manufactured. Further, the electronic device 300 in FIG. 19A is embedded in paper, and bills, securities, bearer bonds, and certificates can be formed using the paper. The electronic device 300 is embedded, whereby the certificates and the like can each have an authentication function and an effect of preventing forgery can be obtained.

Further, the electronic device 300 may be used by being fixed to a variety of goods and objects. As a method for fixing the electronic device 300 to the goods and objects, there are methods such as embedding the electronic device 300 in the goods and objects, and attaching the electronic device 300 to the surface of the goods and objects. Since the electronic device 300 of this embodiment has flexibility, the appearance of an object to which the electronic device 300 is attached is unlikely to be spoiled, and the electronic device 300 can be fixed to a curved surface. Further, as the goods and objects to which the electronic device 300 is fixed, for example, the following can be given: packaging containers (such as wrapping paper and bottles), recording media (such as Blu-ray Discs, DVDs, and USB memories), clothing and accessories (such as bags, glasses, and clothing), foods, plants, animals (such as livestock and pets), commodities, and shipping tags and labels on products and baggage. When the electronic device 300 is fixed to these goods and objects, inspection, distribution management, historical management of the objects, and the like are easily systematized.

For example, when the electronic device 300 is fixed to a shipping tag or a price tag of a product and data stored in the electronic device 300 is read with a reader/writer which is provided beside a conveyor belt, data on a manufacturing process, a distribution process, a delivery destination, and the like is obtained and thus product inspection and stock management can be performed with high efficiency.

Note that this embodiment can be combined with any of the other embodiments as appropriate.

Embodiment 5

In the method for manufacturing the electronic device 300, according to Embodiment 4, the step of forming the openings 466 in the insulating film 465 covering the protrusions 452 is performed and then the step of separating the glass substrate 400 from the functional circuits 302 is performed (see FIGS. 17A and 17B). In this embodiment, an example of a method for manufacturing the electronic device 300, in which these steps are performed in the reverse order, will be described. Description will be given with reference to FIGS. 20A and 20B and FIGS. 21A and 21B.

Figure 20A:
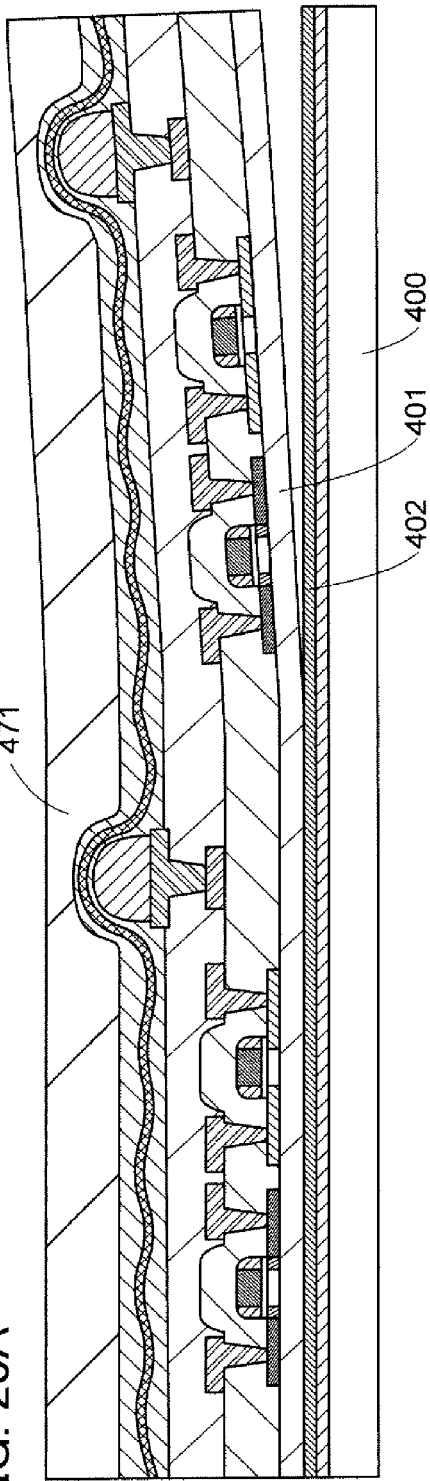
FIGS. 20A and 20B are cross-sectional views illustrating another structure example of steps following the step in FIG. 16C.
Figure 20B:
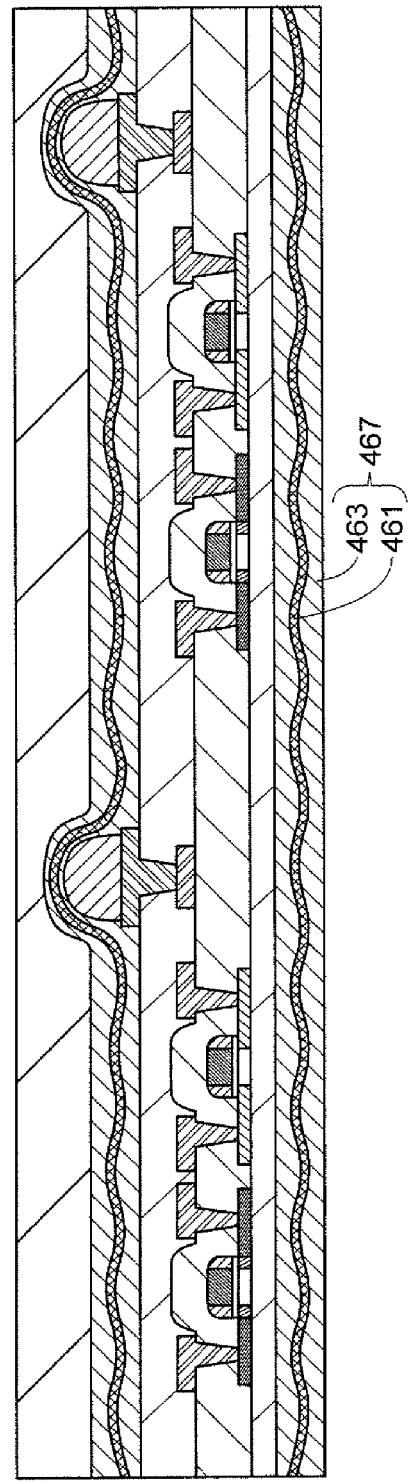

First, the steps up to and including the step in FIG. 16C are performed. Next, as illustrated in FIG. 20A, a heat separation-type adhesive film 471 is attached to the insulating film 465 side of the electronic devices. Then, a stack formed over the base insulating film 401 is separated from the glass substrate 400. This step can be performed in a manner similar to that of the step in FIG. 17B. After that, the insulating film 467 for protecting the base insulating film 401 is formed as illustrated in FIG. 20B. This step can be performed in a manner similar to that of the step in FIG. 18A.

Figure 21A:
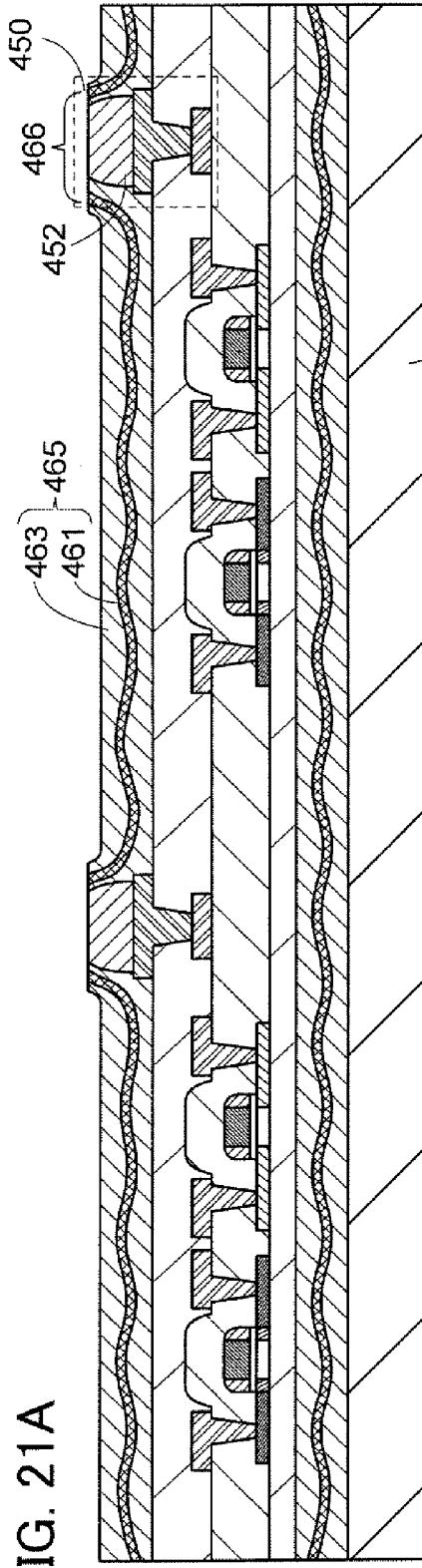
FIGS. 21A and 21B are cross-sectional views illustrating an example of steps following the step in FIG. 20B.

Next, as illustrated in FIG. 21A, the insulating film 465 is selectively removed so that the openings 466 are formed. This step can be performed in a manner similar to that of the step in FIG. 17A. Before the step of removing the insulating film 465 (e.g., the grinding step), the heat separation-type adhesive film 471 is heated to be separated. Further, another heat separation-type adhesive film 472 (hereinafter referred to as a "film 472") is attached to the insulating film 467 side of the electronic devices. Note that the film 472 may be attached after the openings 466 are formed.

Figure 21B:
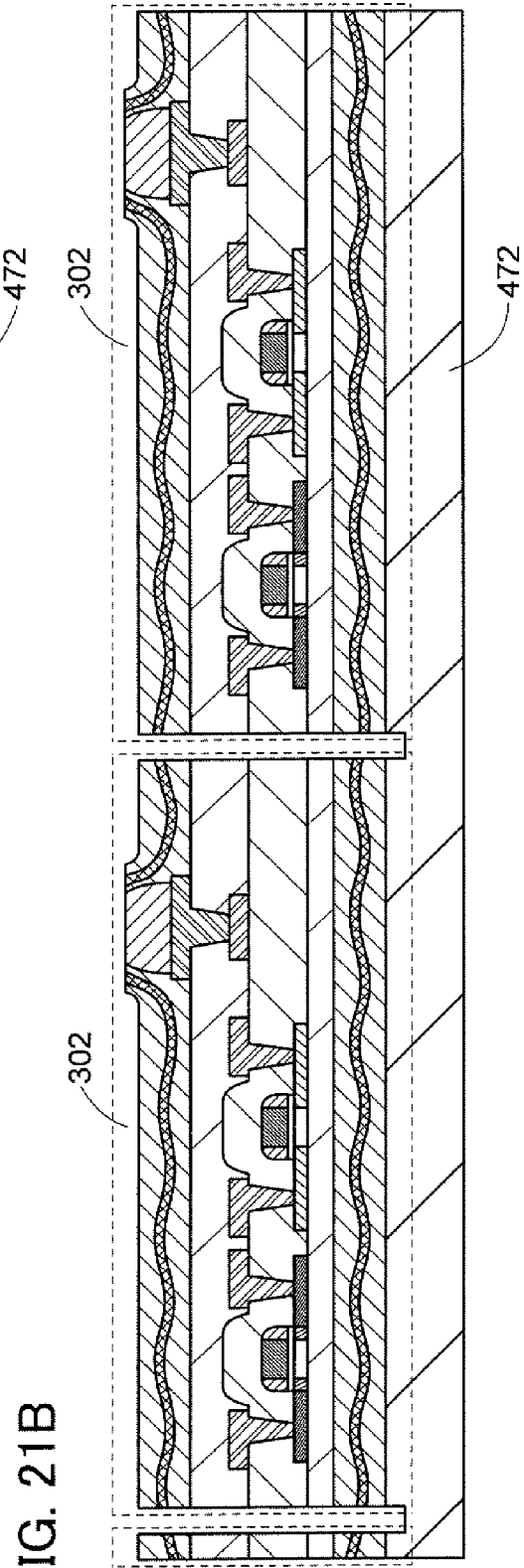

Next, the stack supported by the film 472 is cut into individual functional circuits 302. This step can be performed by treatment such as dicing or scribing, like the step in FIG. 18B. Here, scribing is performed using a laser beam. UV laser beam irradiation is performed from the insulating film 465 side, whereby a groove is formed in the stack supported by the film 472. Accordingly, as illustrated in FIG. 21B, the plurality of functional circuits 302 supported by the film 472 is formed.

Then, the film 472 is heated so that the functional circuit 302 is separated from the film 472, an antenna 301 is electrically connected to the functional circuit 302, and thus, the electronic device 300 is completed (see FIG. 19A). The connection with the antenna 301 can be performed like the step in FIG. 19A.

This embodiment can be combined with any of the other embodiments as appropriate.

Embodiment 6

In the method for manufacturing the electronic device 300, according to Embodiment 4, the step of forming the openings 466 in the insulating film 465 covering the protrusions 452 is performed and then the step of separating the glass substrate 400 from the functional circuits 302 is performed (see FIG. 17A and FIG. 17B). Before the step of separating the glass substrate 400, the functional circuits 302 may be inspected using the protrusions 452 which are exposed. The functional circuit 302 which is determined to be defective in this inspection step is not connected to the antenna 301.

In the method for manufacturing an electronic device 300, according to Embodiment 5, the inspection step may be performed similarly. In the step in FIG. 21A, the functional circuits 302 may be inspected using the protrusions 452 which are exposed. The functional circuit 302 which is determined to be defective in this inspection step is not connected to the antenna 301.

Application of the manufacturing method according to this embodiment is not limited to application to Embodiments 4 and 5. This embodiment is the method for manufacturing an electronic device, in which a protrusion covered with a reinforcing material is exposed and then inspection is performed using the protrusion.

This application is based on Japanese Patent Application serial no. 2009-185126 filed with Japan Patent Office on Aug. 7, 2009, the entire contents of which are hereby incorporated by reference.

What is claimed is:

1. A method for manufacturing an electronic device, comprising the steps of:
    preparing one or more electronic elements covered with a first insulating film;
    forming over the first insulating film a protrusion formed using a conductor which is electrically connected to at least one of the electronic elements;
    attaching a prepreg including a reinforcing material to a top surface of the first insulating film and a surface of the protrusion to form a portion of a top surface of the prepreg, which protrudes due to the protrusion;
    curing the prepreg attached to the top surface of the first insulating film and the surface of the protrusion to form a second insulating film including the reinforcing material; and
    removing a protruding portion of a top surface of the second insulating film together with the reinforcing material to form an opening in the second insulating film.

2. The method for manufacturing an electronic device according to claim 1, wherein the opening is formed in the second insulating film by grinding the second insulating film.

3. The method for manufacturing an electronic device according to claim 1, further comprising the step of:
    forming a conductor in contact with the protrusion after the opening is formed.

4. The method for manufacturing an electronic device according to claim 1, wherein the reinforcing material is a sheet fibrous body.

5. A method for manufacturing an electronic device, comprising the steps of:
   forming a separation film over a substrate;
   preparing one or more electronic elements covered with a second insulating film by forming a first insulating film over the substrate, forming the electronic elements over the first insulating film and forming the second insulating film covering the electronic elements;
   forming over the second insulating film a protrusion formed using a conductor, which is electrically connected to at least one of the electronic elements;
   attaching a first prepreg including a first reinforcing material to a top surface of the second insulating film and a surface of the protrusion to form a portion of a top surface of the first prepreg, which protrudes due to the protrusion;
   curing the first prepreg attached to the top surface of the second insulating film and the surface of the protrusion to form a third insulating film including the first reinforcing material;
   removing a protruding portion of a top surface of the third insulating film together with the first reinforcing material to form an opening in the third insulating film;
   separating the electronic elements from the substrate;
   attaching a second prepreg including a second reinforcing material to the first insulating film so as to cover the first insulating film after the substrate is separated; and
   curing the second prepreg to form a fourth insulating film including the second reinforcing material,
   wherein the separation film is provided between the substrate and the first insulating film, and
   wherein the electronic elements are included in a circuit.

6. The method for manufacturing an electronic device according to claim 5, further comprising the step of:
   electrically connecting an antenna to the protrusion exposed by the opening formed in the third insulating film.

7. The method for manufacturing an electronic device according to claim 5, further comprising the step of:
   forming a conductor in contact with the protrusion exposed by the opening before the substrate is separated from the electronic elements.

8. The method for manufacturing an electronic device according to claim 5, further comprising the steps of:
   forming a conductor in contact with the protrusion exposed by the opening before the substrate is separated from the electronic elements; and
   electrically connecting the conductor and an antenna.

9. The method for manufacturing an electronic device according to claim 5, wherein the opening is formed in the third insulating film by grinding the third insulating film.

10. The method for manufacturing an electronic device according to claim 5, wherein the first reinforcing material and the second reinforcing material are sheet fibrous bodies.

11. The method for manufacturing an electronic device according to claim 5, wherein the electronic elements are separated from the substrate at a region inside the separation film.

12. The method for manufacturing an electronic device according to claim 5, wherein the electronic elements are separated from the substrate at an interface between the separation film and the first insulating film.

13. A method for manufacturing an electronic device, comprising the steps of
   forming a separation film over a substrate;
   preparing one or more electronic elements covered with a second insulating film by forming a first insulating film over the substrate, forming the electronic elements over the first insulating film and forming the second insulating film covering the electronic elements;
   forming over the second insulating film a protrusion formed using a conductor, which is electrically connected to at least one of the electronic elements;
   attaching a first prepreg including a first reinforcing material to a top surface of the second insulating film and a surface of the protrusion to form a portion of a top surface of the first prepreg, which protrudes due to the protrusion;
   curing the first prepreg attached to the top surface of the second insulating film and the surface of the protrusion to form a third insulating film including the first reinforcing material;
   separating the electronic elements from the substrate;
   attaching a second prepreg including a second reinforcing material to the first insulating film so as to cover the first insulating film after the substrate is separated;
   curing the second prepreg to form a fourth insulating film including the second reinforcing material; and
   removing a protruding portion of a top surface of the third insulating film together with the first reinforcing material to form an opening in the third insulating film after the fourth insulating film is formed,
   wherein the separation film is provided between the substrate and the first insulating film, and
   wherein the electronic elements are included in a circuit.

14. The method for manufacturing an electronic device according to claim 13, further comprising the step of:
   electrically connecting an antenna to the protrusion exposed by the opening formed in the third insulating film.

15. The method for manufacturing an electronic device according to claim 13, further comprising the step of:
   forming a conductor in contact with the protrusion after the opening is formed.

16. The method for manufacturing an electronic device according to claim 13, further comprising the steps of:
   forming a conductor in contact with the protrusion after the opening is formed; and
   electrically connecting the conductor and an antenna.

17. The method for manufacturing an electronic device according to claim 13, wherein the opening is formed in the third insulating film by grinding the third insulating film.

18. The method for manufacturing an electronic device according to claim 13, wherein the first reinforcing material and the second reinforcing material are sheet fibrous bodies.

19. The method for manufacturing an electronic device according to claim 13, wherein the electronic elements are separated from the substrate at a region inside the separation film.

20. The method for manufacturing an electronic device according to claim 13, wherein the electronic elements are separated from the substrate at an interface between the separation film and the first insulating film.

21. A method for manufacturing an electronic device, comprising the steps of:
   preparing one or more electronic elements covered with a first insulating film;
   forming over the first insulating film a protrusion formed from a conductor, which is electrically connected to at least one of the electronic elements;
   attaching a resin film to a top surface of the first insulating film and a surface of the protrusion to form a portion of a top surface of the resin film, which protrudes due to the protrusion;

curing the resin film attached to the top surface of the first insulating film and the surface of the protrusion to form a second insulating film; and removing a protruding portion of a top surface of the second insulating film to form an opening in the second insulating film.

22. The method for manufacturing an electronic device according to claim 21, wherein the opening is formed in the second insulating film by grinding the second insulating film.

23. The method for manufacturing an electronic device according to claim 21, further comprising the step of:
forming a conductor in contact with the protrusion after the opening is formed.

24. A method for manufacturing an electronic device, comprising the steps of:
forming a separation film over a substrate;
preparing one or more electronic elements covered with a second insulating film by forming a first insulating film over the substrate, forming the electronic elements over the first insulating film and forming the second insulating film covering the electronic elements;
forming over the second insulating film a protrusion formed from a conductor, which is electrically connected to at least one of the electronic elements;
attaching a first resin film to a top surface of the second insulating film and a surface of the protrusion to form a portion of a top surface of the first resin film, which protrudes due to the protrusion;
curing the first resin film attached to the top surface of the second insulating film and the surface of the protrusion to form a third insulating film;
removing a protruding portion of a top surface of the third insulating film to form an opening in the third insulating film;
separating the electronic elements from the substrate;
attaching a second resin film to the first insulating film so as to cover the first insulating film after the substrate is separated; and
curing the second resin film to form a fourth insulating film,
wherein the separation film is provided between the substrate and the first insulating film, and
wherein the electronic elements are included in a circuit.

25. The method for manufacturing an electronic device according to claim 24, further comprising the step of:
electrically connecting an antenna to the protrusion exposed by the opening formed in the third insulating film.

26. The method for manufacturing an electronic device according to claim 24, further comprising the step of:
forming a conductor in contact with the protrusion exposed by the opening before the substrate is separated from the electronic elements.

27. The method for manufacturing an electronic device according to claim 24, further comprising the steps of:
forming a conductor in contact with the protrusion exposed by the opening before the substrate is separated from the electronic elements; and
electrically connecting the conductor and an antenna.

28. The method for manufacturing an electronic device according to claim 24, wherein the opening is formed in the third insulating film by grinding the third insulating film.

29. The method for manufacturing an electronic device according to claim 24, wherein the electronic elements are separated from the substrate at a region inside the separation film.

30. The method for manufacturing an electronic device according to claim 24, wherein the electronic elements are separated from the substrate at an interface between the separation film and the first insulating film.

31. A method for manufacturing an electronic device, comprising the steps of:
forming a separation film over a substrate;
preparing one or more electronic elements covered with a second insulating film by forming a first insulating film over the substrate, forming the electronic elements over the first insulating film and forming the second insulating film covering the electronic elements;
forming over the second insulating film a protrusion formed from a conductor, which is electrically connected to at least one of the electronic elements;
attaching a first resin film to a top surface of the second insulating film and a surface of the protrusion to form a portion of a top surface of the first resin film, which protrudes due to the protrusion;
curing the first resin film attached to the top surface of the second insulating film and the surface of the protrusion to form a third insulating film;
separating the electronic elements from the substrate;
attaching a second resin film to the first insulating film so as to cover the first insulating film after the substrate is separated;
curing the second resin film to form a fourth insulating film; and
removing a protruding portion of a top surface of the third insulating film to form an opening in the third insulating film after the fourth insulating film is formed,
wherein the separation film is provided between the substrate and the first insulating film, and
wherein the electronic elements are included in a circuit.

32. The method for manufacturing an electronic device according to claim 31, further comprising the step of:
electrically connecting an antenna to the protrusion exposed by the opening formed in the third insulating film.

33. The method for manufacturing an electronic device according to claim 31, further comprising the step of:
forming a conductor in contact with the protrusion after the opening is formed.

34. The method for manufacturing an electronic device according to claim 31, further comprising the steps of:
forming a conductor in contact with the protrusion after the opening is formed; and
electrically connecting the conductor and an antenna.

35. The method for manufacturing an electronic device according to claim 31, wherein the opening is formed in the third insulating film by grinding the third insulating film.

36. The method for manufacturing an electronic device according to claim 31, wherein the electronic elements are separated from the substrate at a region inside the separation film.

37. The method for manufacturing an electronic device according to claim 31, wherein the electronic elements are separated from the substrate at an interface between the separation film and the first insulating film.

* * * * *